United States Patent
Ogata et al.

(10) Patent No.: US 9,261,246 B2
(45) Date of Patent: Feb. 16, 2016

(54) LIGHT-EMITTING MODULE, LIGHT SOURCE DEVICE, LIQUID CRYSTAL DISPLAY DEVICE, AND METHOD OF MANUFACTURING LIGHT-EMITTING MODULE

(75) Inventors: Toshifumi Ogata, Osaka (JP); Kenji Sugiura, Osaka (JP); Makoto Morikawa, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 18 days.

(21) Appl. No.: 13/265,821

(22) PCT Filed: Mar. 11, 2011

(86) PCT No.: PCT/JP2011/001443
§ 371 (c)(1),
(2), (4) Date: Oct. 21, 2011

(87) PCT Pub. No.: WO2011/111399
PCT Pub. Date: Sep. 15, 2011

(65) Prior Publication Data
US 2012/0044669 A1   Feb. 23, 2012

(30) Foreign Application Priority Data
Mar. 11, 2010   (JP) .................... 2010-054268

(51) Int. Cl.
*F21K 99/00* (2010.01)
*F21V 3/00* (2015.01)
(Continued)

(52) U.S. Cl.
CPC .............. *F21K 9/90* (2013.01); *F21K 9/1355* (2013.01); *F21V 3/00* (2013.01); *F21V 17/101* (2013.01); *H05K 3/284* (2013.01); *F21V 19/005* (2013.01); *F21V 19/0055* (2013.01);
(Continued)

(58) Field of Classification Search
CPC ....... F21K 9/90; F21K 9/1355; F21V 17/101; F21V 3/00; F21V 29/89; F21V 29/507
See application file for complete search history.

(56) References Cited

U.S. PATENT DOCUMENTS

2004/0104391 A1   6/2004   Maeda et al.
2005/0173708 A1   8/2005   Suehiro et al.
(Continued)

FOREIGN PATENT DOCUMENTS

CN   1628390   6/2005
CN   101266968   9/2008
(Continued)

OTHER PUBLICATIONS

Machine English translation of JP 2009010308 A to Sanpei et al.*
(Continued)

*Primary Examiner* — Anne Hines

(57) ABSTRACT

Provided is a light-emitting module, a light source device and a liquid crystal display device in which unevenness in the luminance and color hardly occurs as compared to conventional technology. A light-emitting module 100 is structured such that a plurality of element columns, each composed of light-emitting elements 120 arranged in line, are mounted on a substrate 110, and each element column is individually sealed by a separate sealing member 130. The light source device and the liquid crystal device each include the above light-emitting module 100.

7 Claims, 18 Drawing Sheets

(51) Int. Cl.

| | | |
|---|---|---|
| *F21V 17/10* | (2006.01) | |
| *H05K 3/28* | (2006.01) | |
| *F21V 19/00* | (2006.01) | |
| *F21Y 101/02* | (2006.01) | |
| *F21Y 105/00* | (2006.01) | |
| *H01L 25/075* | (2006.01) | |
| *H01L 33/54* | (2010.01) | |
| *F21V 29/507* | (2015.01) | |
| *F21V 29/89* | (2015.01) | |

(52) U.S. Cl.
CPC .............. *F21V 29/507* (2015.01); *F21V 29/89* (2015.01); *F21Y 2101/02* (2013.01); *F21Y 2105/001* (2013.01); *H01L 25/0753* (2013.01); *H01L 33/54* (2013.01); *H01L 2224/45139* (2013.01); *H01L 2224/45144* (2013.01); *H01L 2224/48091* (2013.01); *H01L 2224/48227* (2013.01); *H01L 2924/3025* (2013.01); *H05K 2201/10106* (2013.01)

(56) References Cited

U.S. PATENT DOCUMENTS

| | | | |
|---|---|---|---|
| 2005/0227569 A1 | 10/2005 | Maeda et al. | |
| 2005/0285926 A1* | 12/2005 | Mizuyoshi | 347/212 |
| 2006/0086384 A1 | 4/2006 | Nakata | |
| 2006/0124942 A1 | 6/2006 | Maeda et al. | |
| 2006/0186431 A1 | 8/2006 | Miki et al. | |
| 2007/0037747 A1 | 2/2007 | Ma et al. | |
| 2007/0046169 A1 | 3/2007 | Maeda et al. | |
| 2007/0114555 A1 | 5/2007 | Takemoto et al. | |
| 2008/0128739 A1 | 6/2008 | Sanpei et al. | |
| 2008/0135862 A1 | 6/2008 | Maeda et al. | |
| 2008/0224608 A1 | 9/2008 | Konishi et al. | |
| 2009/0031504 A1 | 2/2009 | Lang | |
| 2009/0166657 A1 | 7/2009 | Yamada et al. | |
| 2009/0194783 A1 | 8/2009 | Takemoto et al. | |
| 2009/0231833 A1 | 9/2009 | Miki et al. | |
| 2009/0283779 A1* | 11/2009 | Negley et al. | 257/88 |
| 2009/0296017 A1 | 12/2009 | Itoh et al. | |
| 2009/0315054 A1 | 12/2009 | Kim et al. | |
| 2009/0315057 A1* | 12/2009 | Konishi et al. | 257/98 |
| 2010/0188852 A1 | 7/2010 | Sanpei et al. | |
| 2011/0057569 A1* | 3/2011 | Wei et al. | 315/122 |
| 2011/0084297 A1* | 4/2011 | Ogata et al. | 257/98 |
| 2011/0116005 A1* | 5/2011 | Sakai et al. | 349/61 |
| 2011/0182073 A1 | 7/2011 | Sanpei et al. | |
| 2012/0007112 A1 | 1/2012 | Yamada et al. | |

FOREIGN PATENT DOCUMENTS

| | | |
|---|---|---|
| JP | S52-120552 | 9/1977 |
| JP | 05-299702 | 11/1993 |
| JP | 11-274572 | 10/1999 |
| JP | 2004-253534 | 9/2004 |
| JP | 2006-049857 | 2/2006 |
| JP | 2006-229055 | 8/2006 |
| JP | 2006/351708 | 12/2006 |
| JP | 2007-158009 | 6/2007 |
| JP | 2007-294991 | 11/2007 |
| JP | 2008-091354 | 4/2008 |
| JP | 2008/244165 | 10/2008 |
| JP | 2009-021221 | 1/2009 |
| JP | 2009010308 A * | 1/2009 |
| JP | 2009-038315 | 2/2009 |
| JP | 2009-147281 | 7/2009 |
| JP | 2009-164157 | 7/2009 |
| JP | 2010-010681 | 1/2010 |
| JP | 2010/278266 | 12/2010 |

OTHER PUBLICATIONS

Japanese Patent Application No. 2012-168166 Office Action dated Sep. 25, 2012, 2 pages.
Japanese Patent Application No. 2012-168164 Office Action dated Sep. 25, 2012; 2 pages.
European Application No. 11753062.6 Extended Search Report dated Nov. 26, 2013, 12 pages.
Office Action Issued on Oct. 20, 2015 for China Patent Application No. CN201180001913.X, filed on Mar. 11, 2011 (with partial English language translation) (11 pages).

* cited by examiner

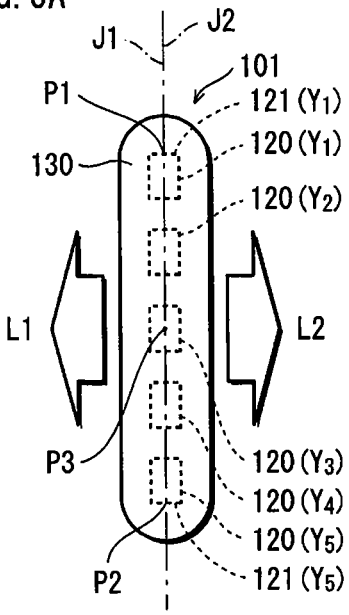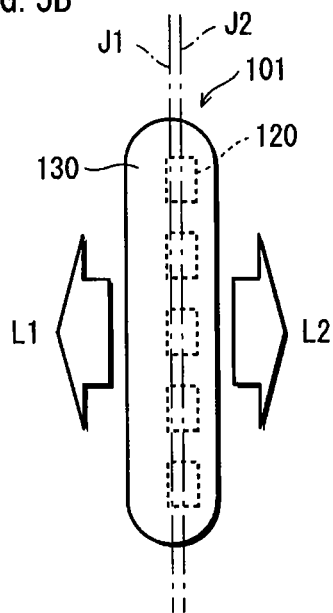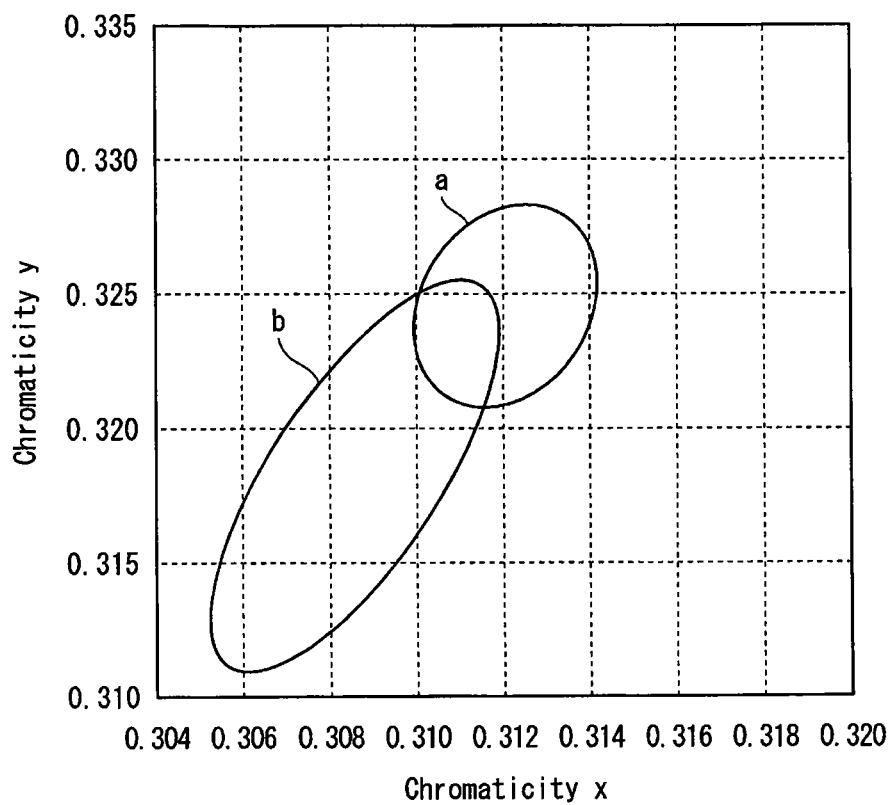

LIGHT-EMITTING MODULE, LIGHT SOURCE DEVICE, LIQUID CRYSTAL DISPLAY DEVICE, AND METHOD OF MANUFACTURING LIGHT-EMITTING MODULE

TECHNICAL FIELD

The present invention relates to a light-emitting module having a plurality of light-emitting elements such as light-emitting diodes (LEDs), a light source device, a liquid crystal display device, and a method of manufacturing the light-emitting module.

BACKGROUND ART

In recent years, there is a growing demand for conservation of resources in the field of light source devices such as halogen light bulbs and fluorescent lamps, and many developments are carried out on light-emitting modules using LEDs with power-saving capabilities and long life. In such light-emitting modules, shortage of luminance caused by using the LEDs alone is supplemented by high integration of the LEDs. For example, Patent Literature 1 discloses a light-emitting module in which a plurality of LDS are arranged on a substrate in a matrix and sealed by a sealing member as a whole (see Patent Literature 1).

CITATION LIST

Patent Literature

[Patent Literature 1]
JP Patent Application Publication No. 2008-244165

SUMMARY OF INVENTION

Technical Problem

The above structure, however, makes the temperature of the central portion of the sealing member higher than the temperature of the outer edge portion of the sealing member when the LEDs generate heat. This is because the heat conducted to the central portion of the sealing member originates from a large number of LEDs, whereas the heat conducted to the outer edge portion of the sealing member originates from a fewer number of LEDs. One reasoning behind this is that no LEDs are arranged at the outer edge portion of the sealing member. Another reasoning is that although it is difficult for the central portion of the sealing member to lose heat since it is enclosed by the outer edge portion of the sealing member, it is easy for the outer edge portion of the sealing member to lose heat since its exterior is in contact with the outer air.

The properties of LEDs are such that the luminance of LEDs decreases at an excessively high temperature. Also, the properties of phosphors contained in the sealing member are such that the excitation efficiency of the phosphors decreases at an excessively high temperature. For the above reasons, the luminance of LEDs and the excitation efficiency of phosphors easily decrease in the high-temperature central portion of the sealing member. This is the cause of unevenness in the luminance and color of the light-emitting module.

In view of the above problem, the present invention aims to provide a light-emitting module, a light source device and a liquid crystal display device in which unevenness in the luminance and color hardly occurs compared to conventional technology. The present invention also aims to provide a method of manufacturing a light-emitting module in which unevenness in the luminance and color hardly occurs.

Solution to Problem

To achieve the above aims, one aspect of the present invention is a light-emitting module comprising: a substrate; a plurality of element columns mounted on the substrate in rows, each element column including a plurality of light-emitting elements arranged in line; and a plurality of sealing members sealing the element columns in one-to-one correspondence therewith.

Another aspect of the present invention is a light source device comprising the above light-emitting module as a light source.

Another aspect of the present invention is a liquid crystal display device comprising a backlight unit including the above light-emitting module.

Another aspect of the present invention is a method of manufacturing a light-emitting module, the method comprising the steps of: preparing a substrate on which a plurality of element columns are mounted in rows, each element column including a plurality of light-emitting elements arranged in line; applying a plurality of lines of paste to the element columns in one-to-one correspondence such that each line of paste extends along the corresponding element column; and forming a plurality of sealing members by solidifying the applied lines of paste, each sealing member sealing the light-emitting elements included in the corresponding element column.

Advantageous Effects of Invention

In the light-emitting module, light source device and liquid crystal display device pertaining to aspects of the present invention, a plurality of element columns, each of which is constituted by light-emitting elements arranged in line, are mounted on a substrate in rows. Here, each element column is individually sealed by a separate sealing member. With this structure, the heat from light-emitting elements sealed by one sealing member is hardly conducted to other sealing members, and each sealing member easily loses the heat since its exterior is in contact with the outer air. As a result, the sealing members hardly have an excessively high temperature on a local basis, and the luminance of LEDs and the excitation efficiency of phosphors hardly decrease. Therefore, unevenness in the luminance and color hardly occurs.

One aspect of the present invention is a method of manufacturing a light-emitting module, the method comprising the steps of: preparing a substrate on which a plurality of element columns are mounted in rows, each element column including a plurality of light-emitting elements arranged in line; applying a plurality of lines of paste to the element columns in one-to-one correspondence such that each line of paste extends along the corresponding element column; and forming a plurality of sealing members by solidifying the applied lines of paste, each sealing member sealing the light-emitting elements included in the corresponding element column. This method allows manufacturing the above-described light-emitting module in which unevenness in the luminance and color hardly occurs.

BRIEF DESCRIPTION OF DRAWINGS

FIGS. 5A and 5B illustrate a positional relationship between a sealing member and light-emitting elements.

FIG. 6 illustrates the effect of a positional relationship between a sealing member and light-emitting elements on the color of light.

DESCRIPTION OF EMBODIMENTS

The following describes aspects of the present invention, namely a light-emitting module, a light source device, a liquid crystal display device, and a method of manufacturing a light-emitting module, with reference to the accompanying drawings.

First Embodiment (Overall Structure)

Figure 1:
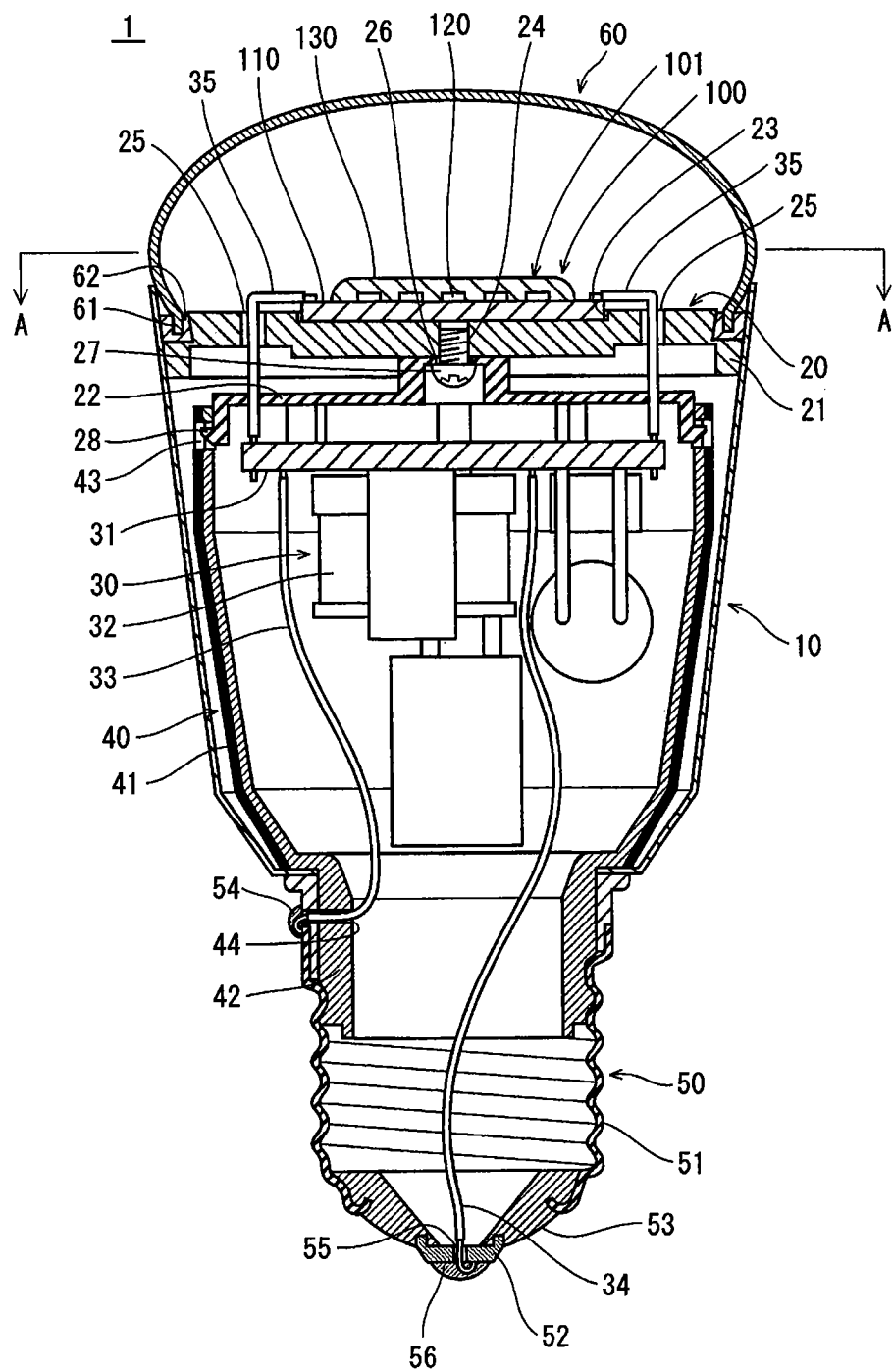
FIG. 1 is a cross-sectional view showing a light source device pertaining to First Embodiment.
Figure 2:
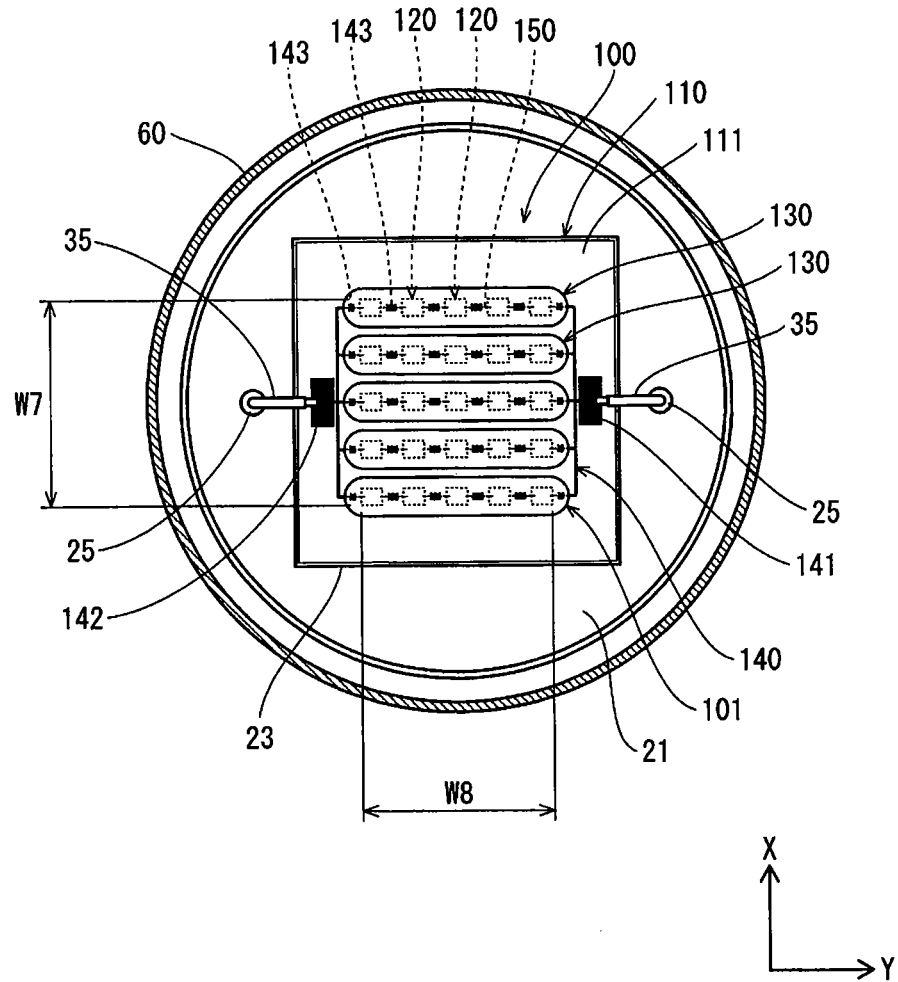
FIG. 2 shows a cross section taken along A-A in FIG. 1.

FIG. 1 is a cross-sectional view showing a light source device pertaining to the present embodiment. FIG. 2 shows a cross section taken along A-A in FIG. 1. As shown in FIG. 1, an LED lamp 1, which is herein described as an example of a light source device pertaining to First Embodiment, includes the following main structural elements: a housing 10; a holder 20; a lighting circuit unit 30; a circuit case 40; a base 50; a globe 60; and an LED module 100, which is herein described as an example of a light-emitting module pertaining to First Embodiment.

(Housing)

The housing 10 has a shape of, for example, a circular cylinder. The LED module 100 is disposed at one opening of the housing 10. The base 50 is disposes at the other opening of the housing 10. A highly heat-conductive material (e.g., aluminum) is used as a base material of the housing 10, so that the housing 10 functions as a heat dissipating member (heat sink) that dissipates heat from the LED module 100.

(Holder)

The holder 20 is made up of a module holding portion 21 and a circuit holding portion 22.

As shown in FIG. 2, the module holding portion 21, which has a shape of a substantially circular plate, is used to attach the LED module 100 to the housing 10. A substantially quadrilateral recess 23 that matches a substrate 110 in shape is formed in the substantial center of the main surface of the module holding portion 21, the main surface of the module holding portion 21 facing the LED module 100. As shown in FIG. 1, the LED module 100 is secured to the module holding portion 21 using an adhesive or a screw, with the substrate 110 fit in the recess 23 and the back surface of the substrate 110 adhered to the bottom surface of the recess 23.

A screw hole 24 and through holes 25 are also formed in the module holding portion 21. The screw hole 24 is for joining the module holding portion 21 and the circuit holding portion 22. Lead wires 35 of the lighting circuit unit 30 are inserted through the through holes 25. The module holding portion 21 is made of a highly heat-conductive material such as aluminum. Due to the properties of such a material, the module holding portion 21 also functions as a heat-conducting member that conducts heat from the LED module 100 to the housing 10.

The circuit holding portion 22 has a shape of a substantially circular dish. A boss hole 26 for joining the circuit holding portion 22 and the module holding portion 21 is formed in the center of the circuit holding portion 22. The module holding portion 21 and the circuit holding portion 22 are integrally secured to each other by screwing a screw 27 that has been inserted through the boss hole 26 into the screw hole 24 of the module holding portion 21.

A latching pawl 28 that latches with the circuit case 40 is provided along the outer circumference of the circuit holding portion 22. It is preferable that the circuit holding portion 22 be made of a material with a low relative density, such as synthetic resin, for the purpose of weight reduction. By way of example, the circuit holding portion 22 is made of polybutylene terephthalate (PBT) in the present example.

(Lighting Circuit Unit)

The lighting circuit unit 30 is made up of a circuit substrate 31 and a plurality of electronic components 32 mounted on the circuit substrate 31. The lighting circuit unit 30 is housed in the housing 10 with the circuit substrate 31 secured to the circuit holding portion 22.

(Case)

The circuit case 40 is made up of a cover portion 41 covering the lighting circuit unit 30 and a base attachment portion 42 that extends from the cover portion 41 and has a smaller diameter than the cover portion 41. The circuit case 40 is attached to the circuit holding portion 22 with the lighting circuit unit 30 housed therein. A latching hole 43 that latches with the latching pawl 28 of the circuit holding portion 22 is formed in the cover portion 41. The circuit case 40 is attached to the circuit holding portion 22 by the latching pawl 28 latching with the latching hole 43. It is preferable that the circuit case 40 be made of the same material as the circuit holding portion 22 for the above-mentioned reason. By way of example, the circuit case 40 is also made of polybutylene terephthalate in the present example.

(Base)

The base 50 conforms to, for example, the standard for an Edison screw specified in Japanese Industrial Standards (JIS), and is used while being attached to a socket (not illustrated) designed for a general incandescent light bulb. More specifically, an E26 base is used as the base 50 when the LED lamp 1 corresponds to a 60-watt incandescent light bulb, and an E17 base is used as the base 50 when the LED lamp 1 corresponds to a 40-watt incandescent light bulb.

The base 50 is made up of a shell 51, which is also called a tubular body portion, and an eyelet 52 having a shape of a circular dish. The shell 51 and the eyelet 52 are formed as a unitary component with an insulation member 53 therebetween, the insulation member 53 being made of a glass material. The base 50 is attached to the circuit case 40 with the shell 51 fit around the base attachment portion 42. A through hole 44 is formed in the base attachment portion 42. One power supply wire 33 of the lighting circuit unit 30 is inserted through the through hole 44 so as to extend to the outside. A part of the power supply wire 33 that is exposed to the outside is electrically connected to the shell 51 by soldering 54. A through hole 55 is formed in the central portion of the eyelet 52. Another power supply wire 34 of the lighting circuit unit 30 is inserted through the through hole 55 so as to extend to the outside. A part of the power supply wire 34 that is exposed to the outside is electrically connected to the eyelet 52 by soldering 56.

(Globe)

The globe 60 has a shape of a substantial dome. An edge 61 of the globe 60 at the opening of the globe 60 is secured to the housing 10 and the module holding portion 21 by an adhesive 62 such that the globe 61 covers the LED module 100.

(LED Module)

Figure 3:
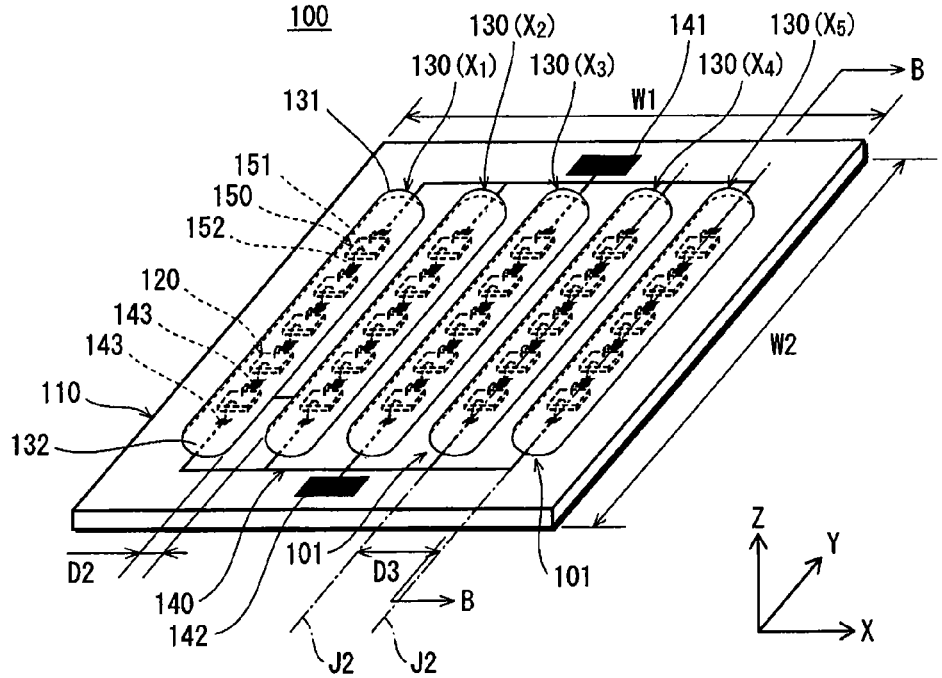
FIG. 3 is a perspective view showing a light-emitting module pertaining to First Embodiment.
Figure 4A:
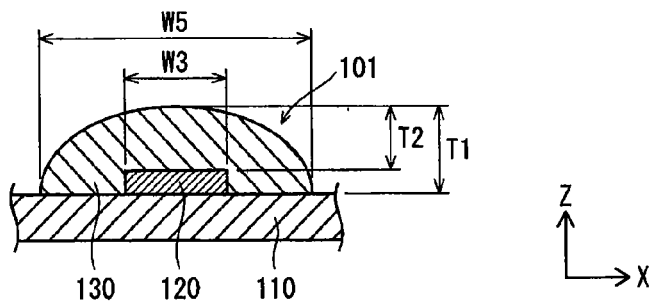
FIGS. 4A and 4B are cross-sectional views showing a sealing member.
Figure 4B:
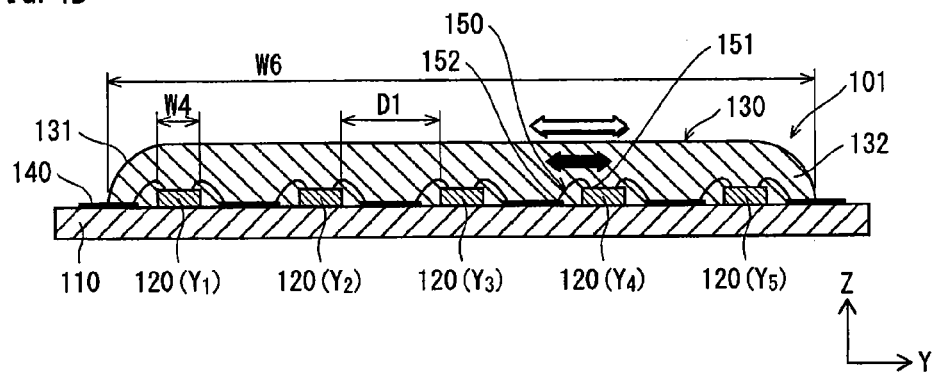

FIG. 3 is a perspective view showing the light-emitting module pertaining to the present embodiment. FIGS. 4A and 4B are cross-sectional views showing a sealing member. More specifically, FIG. 4A shows a cross section taken along the widthwise direction of the sealing member, and FIG. 4B shows a cross section taken along the lengthwise direction of the sealing member (i.e., along B-B in FIG. 3). As shown in FIG. 3, the LED module 100 is composed of the substrate 110, a plurality of LEDs (light-emitting elements) 120, and a plurality of sealing members 130.

By way of example, the substrate 110 has a shape of a substantially quadrilateral plate and has a double-layer structure including (i) an insulation layer made of a ceramic substrate, heat-conductive resin, or the like, and (ii) a metallic layer made of an aluminum plate or the like. When viewed in a direction perpendicular to a mount surface 111 of the substrate 110 on which various components are mounted (hereinafter expressed as "in a plan view"), the substrate 110 has (i) a width W1 of 12 mm to 30 mm along its widthwise direction (the X-axis direction) and (ii) a width W2 of 12 mm to 30 mm along its lengthwise direction (the Y-axis direction).

As shown in FIGS. 4A and 4B, each LED 120 is, for example, a GaN LED that emits blue light. In a plan view, each LED 120 has a substantially quadrilateral shape and has (i) a width W3 of 0.3 mm to 1.0 mm along its widthwise direction (the X-axis direction) and (ii) a width W4 of 0.3 mm to 1.0 mm along its lengthwise direction (the Y-axis direction). Each LED 120 has a thickness (a width along the Z-axis direction) of 0.08 mm to 0.30 mm.

Each LED 120 is arranged so that in a plan view, the direction of its largest width (i.e., the lengthwise direction) is parallel to the direction along which the corresponding element column extends. According to this structure, each LED 120 has a small width along the row direction. This reduces the width W5 of each sealing member 130 along the widthwise direction (the X-axis direction) in a plan view. As a result of reducing the width W5 of each sealing member 130, the distance between two neighboring sealing members 130 is increased, thus improving the heat dissipation properties of the sealing members 130.

Each of the element columns is constituted by a plurality of LEDs 120 arranged in line. These element columns are mounted on the substrate 110 in parallel rows so as to extend along the row direction. To be more specific, by way of example, there is a total of twenty-five LEDs 120 mounted in a five-by-five matrix. That is to say, each element column consists of five LEDs 120, and five element columns are mounted in rows. Note that the structure of the plurality of LEDs 120 is not limited to the above-described example (i.e., a total of twenty-five LEDs 120 mounted in a five-by-five matrix). It suffices if four or more LEDs 120 are mounted in at least a two-by-two matrix.

In each element column, LEDs 120 are linearly arranged along the column direction (the Y-axis direction). By thus linearly arranging the LEDs 120, each of the sealing members 130 for sealing the LEDs 120 can also be formed in a linear shape. Since it is easy to form each sealing member 130 in a linear shape, the productivity of an LED module 100 is improved when each sealing member 130 is formed in a linear shape. Furthermore, when each sealing member 130 is formed in a linear shape, high integration of the LEDs 120 is easy, which can increase the luminance of the LED module 100. To be more specific, by the term "linear shape", it means that each LED 120 is mounted such that its center has a tolerance of 30-μm shift or less from an arrangement axis J2 of the corresponding element column (the arrangement axis J2 passes through centers of all the light-emitting elements included in the corresponding element column in a plan view).

A distance D1 between two neighboring LEDs 120 belonging to the same element column, as shown in FIG. 4B, is preferably in a range of 1.0 mm to 3.0 mm. If the distance D1 is smaller than the above range, the heat from the LEDs 120 does not sufficiently dissipate. On the other hand, if the distance D1 is greater than the above range, the aforementioned distance between two neighboring LEDs 120 becomes too large; this could cause unevenness in the luminance.

Each element column is individually sealed by a separate sealing member 130 having an elongated shape. Each element column and the corresponding sealing member 130 sealing the same together form one light-emitting unit 101. Put another way, the LED module 100 has five light-emitting units 101.

Each sealing member 130 is made of a resin material having light transmitting properties and containing phosphors. Examples of such a resin material include silicone resin, fluororesin, silicone-epoxy hybrid resin, and urea resin. Powders of YAG phosphors (($Y,Gd)_3Al_5O_{12}:Ce^{3+}$), silicate phosphors (($Sr,Ba)_2SiO_4:Eu^{2+}$), nitride phosphors (($Ca,Sr,Ba)AlSiN_3:Eu^{2+}$), oxynitride phosphors ($Ba_3Si_6O_{12}N_2:Eu^{2+}$), or the like may be used as the phosphors. As a result, part of the blue light emitted from the LEDs 120 is converted to yellow-green light, and the color mixture produces white light. Note that the sealing members 130 do not necessarily have to contain phosphors.

Returning to FIG. 3, in a case where phosphors are contained in the sealing members 130 ($X_1$ to $X_5$) each sealing the corresponding element column, the sealing members 130 ($X_1$ to $X_5$) need not contain identical phosphors. The sealing members 130 ($X_1$ to $X_5$) may contain phosphors that exhibit different colors among element columns. For example, the sealing members 130 ($X_1$), 130 ($X_3$) and 130 ($X_5$) may be made of a resin material having light transmitting properties and containing selected phosphors that exhibit a daylight color, and the sealing members 103 ($X_2$) and 130 ($X_4$) may be made of a resin material having light transmitting properties and containing selected phosphors that exhibit an incandescent light color. This structure enables the light-emitting units to produce a mixture of a daylight color and an incandescent light color. Furthermore, the light-emitting units can freely switch between different colors if lighting control is performed with respect to each of the element columns that have different color temperatures. Note that the daylight color denotes a color having a color temperature of approximately 5700 K to 7100 K, whereas the incandescent light color denotes a color having a color temperature of approximately 2600 K to 3150 K.

FIGS. 5A and 5B illustrate a positional relationship between a sealing member and light-emitting elements. More specifically, FIG. 5A illustrates a state where a central axis J1 is coaxially aligned with the arrangement axis J2, and FIG. 5B illustrates a state where the central axis J1 is not coaxially aligned with the arrangement axis J2. FIG. 6 illustrates the effect of a positional relationship between a sealing member and light-emitting elements on the color of light.

In a light-emitting unit 101 shown in FIG. 5A, the central axis J1 extending along the lengthwise direction of a sealing member 130 is coaxially aligned with the arrangement axis J2 of an element column. As in this case, when the central axis J1 and the arrangement axis J2 are coaxially aligned, emitted light L1 and emitted light L2 are both white. On the other hand, when the central axis J1 and the arrangement axis J2 are not coaxially aligned as shown in FIG. 5B, emitted light L1 is yellowish white, and emitted light L2 is bluish white. That is to say, in the case of FIG. 5B, unevenness in the color of emitted light occurs among the light-emitting units 101.

To be more specific, in a case where the central axis J1 and the arrangement axis J2 are coaxially aligned, light emitted from the light-emitting units 101 has the chromaticity distribution indicated by the reference sign "a" in FIG. 6. On the other hand, in a case where the arrangement axis J2 is off the central axis J1 by, for example, 150 μm, light emitted from the light-emitting units 101 has the chromaticity distribution indicated by the reference sign "b" in FIG. 6. In view of the above, it is preferable that the central axis J1 and the arrangement axis J2 be coaxially aligned in order to prevent unevenness in the color of emitted light among the light-emitting units 101.

Returning to FIG. 3, a distance D2 between two neighboring sealing members 130 along the row direction (the X-axis direction) is, for example, 1.0 mm. It is preferable that the distance D2 be in a range of 0.2 mm to 3.0 mm. If the distance D2 is smaller than the above range, the effect of heat dissipation, which is obtained by providing a gap between two neighboring sealing members 130, is not sufficient. On the other hand, if the distance D2 is greater than the above range, a gap between two neighboring element columns becomes too large, and unevenness in the luminance easily occurs.

As shown in FIG. 4A or 4B, each sealing member 130 has (i) a width W5 of 0.8 mm to 3.0 mm along its widthwise direction (the X-axis direction), (ii) a width W6 of 3.0 mm to 40.0 mm along its lengthwise direction (the Y-axis direction), (iii) a maximum thickness T1, including the LEDs 120, of 0.4 mm to 1.5 mm (the width along the Z-axis direction), and (iv) a maximum thickness T2, excluding the LEDs 120, of 0.2 mm to 1.3 mm. In order to secure reliability of sealing, the width W5 of each sealing member 130 is preferably two to seven times the width W3 of each LED 120.

Each sealing member 130 has a substantially semielliptic cross section along its widthwise direction. End portions 131 and 132 of each sealing member 130 in the lengthwise direction have a round shape. More specifically, the end portions 131 and 132 of each sealing member 130 in the lengthwise direction have a shape of a substantial quarter of a sphere. Put another way, in a plan view, the end portions 131 and 132 have a substantially semicircular shape (see FIG. 2). The cross sections of the end portions 131 and 132 along the lengthwise direction have a shape of a substantially circular sector with a central angle of approximately 90° (see FIG. 4B). When the end portions 131 and 132 of each sealing member 130 in the lengthwise direction have a round shape as described above, stress concentration hardly occurs at the end portions 131 and 132, and the light emitted from the LEDs 120 easily illuminates the outside of each sealing member 130.

Figure 7A:
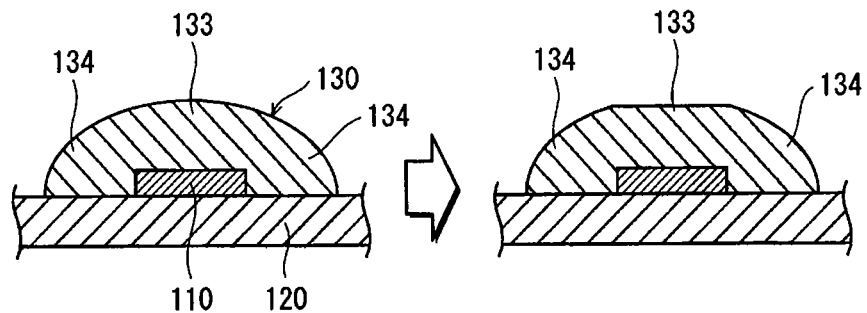
FIGS. 7A and 7B are cross-sectional views illustrating thermal deformation of a sealing member.
Figure 7B:
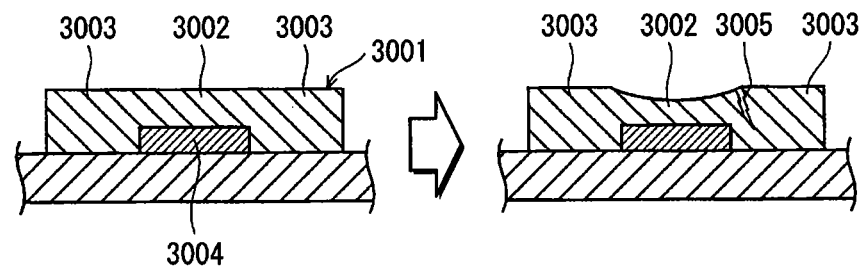

FIGS. 7A and 7B are cross-sectional views illustrating thermal deformation of a sealing member. More specifically, FIG. 7A shows a sealing member pertaining to the present embodiment, and FIG. 7B shows a general sealing member. Typically, the temperature of a portion of a sealing member 130 in the vicinity of an LED 120 easily becomes high; such a portion with a high temperature is susceptible to thermal deformation and contraction. In view of the above, as shown in FIG. 7A, a central portion 133 of a sealing member 130 in the widthwise direction is close to an LED 120 and therefore easily contracts. On the other hand, end portions 134 of the sealing member 130 in the widthwise direction are distanced from the LED 120 and therefore do not easily contract.

Since the sealing member 130 pertaining to the present embodiment has a substantially semielliptic cross section along the widthwise direction, the central portion 133 has a relatively large thickness. Hence, even if the central portion 133 contracts to a certain extent and consequently becomes thinner, there is hardly any difference between the thickness of the central portion 133 and the thickness of the end portions 134.

On the other hand, as shown in FIG. 7B, in the case of a general sealing member 3001 that has a substantially rectangular cross section along the widthwise direction, a central portion 3002 has a smaller thickness than end portions 3003 due to the existence of an LED 3004. In this case, if the central portion 3002 contracts and consequently becomes thinner, the difference between the thickness of the central portion 3002 and the thickness of the end portions 3003 becomes large. This may, for example, cause a crack to form in a portion 3005 between the central portion 3002 and the end portions 3003. Accordingly, it is preferable for each sealing member 130 to have a substantially semielliptic or semicircular cross section along the widthwise direction. It is also preferable that the thickness T1 be ¼ to ⅔ of the width W5.

Each LED 120 is mounted face-up on the substrate 110, and is electrically connected to the lead wires 35 of the lighting circuit unit 30 via a wiring pattern 140 formed on the substrate 110. The wiring pattern 140 has a pair of lands 141 and 142 for power supply, and a plurality of lands 143 for bonding. The lands 143 are disposed so as to have a certain positional relationship with the LEDs 120.

As shown in FIG. 3, each LED 120 is electrically connected to corresponding lands 143 by, for example, wires (e.g., metallic wires) 150 in the form of wire bonding. Here, each wire 150 has one end 151 joined to the corresponding LED 120 and the other end 152 joined to the corresponding land 143. Each wire 150 is arranged to extend along the element column to which the light-emitting element that is to be connected to the wire 150 belongs (i.e., along the arrangement axis J2). Both ends 151 and 152 of each wire 150 are also arranged to extend along that element column. The wires 150 hardly deteriorate because they are sealed by the sealing members 130 together with the LEDs 120 and the lands 143. The wires 150 are also highly safe since they are insulated. The LEDs 120 is not limited to being mounted face-up on the substrate 110, but may be flip chip mounted on the substrate 110.

The LEDs 120 are connected to one another by a so-called series-parallel connection. More specifically, five LEDs 120 belonging to the same element column are connected in series to one another, and five element columns are connected in parallel to one another. The form of connection between the LEDs 120 is not limited to the above example. The LEDs 120 may be connected to one another in any manner, irrespective of the element columns.

The pair of lead wires 35 of the lighting circuit unit 30 are connected to the lands 141 and 142. The LEDs 120 emit light by the lighting circuit unit 30 supplying power to the LEDs 120 via the pair of lead wires 35.

According to the above-described LED module 100, each element column constituted by a group of LEDs 120 is individually sealed by a separate sealing member 130 having an elongated shape. Therefore, the above-described LED module 100 is less likely to have an excessively high temperature on a local basis than an LED module in which all LEDs 120 are collectively sealed by one sealing member. Hence, the above-described LED module 100 hardly brings about (i) a reduction in the luminance of LEDs 120 and a reduction in the excitation efficiency of phosphors, which are attributed to an excessively high temperature in local areas, and (ii) unevenness in the luminance and color of the LED module 100.

When the sealing members 130 have a high temperature in local areas, there will be a difference in the degree of expansion among different areas of the sealing members 130, thus increasing the internal stress of the sealing members 130. This causes formation of cracks and the like, which lowers reliability of sealing. However, in the case of the LED module 100 pertaining to the present embodiment, each sealing member 130 is formed to extend along the corresponding element column, and expands and contracts mainly in the direction along which the corresponding element column extends. Thus, the internal stress of the LED module 100 pertaining to the present embodiment hardly increases, and reliability of sealing hardly lowers.

Furthermore, since there is a gap between two neighboring sealing members 130, the material used to form the sealing members 130 can be saved for such a gap, and therefore the cost of the LED module 100 can be reduced.

The above-described structure (each element column constituted by a group of LEDs 120 is individually sealed by a separate sealing member 130 having an elongated shape) is especially effective for an LED module with highly-integrated LEDs 120. High integration can be defined by a pitch between two neighboring element columns (i.e., a distance D3 between arrangement axes J2 of two neighboring element columns, see FIG. 3). It can be said that the LEDs 120 are highly integrated when the pitch between two neighboring element columns is smaller than or equal to 5.0 mm. The pitch between two neighboring element columns is preferably smaller than or equal to four times the width W5 of each sealing member 130, or more preferably smaller than or equal to three times the width W5 of each sealing member 130.

Alternatively, high integration may be defined by, for example, the ratio of an area actually occupied by the LEDs 120 to an element mounting area (i.e., an area defined by a width W7×a width W8 shown in FIG. 2). Hereinafter, this ratio is referred to as an "area occupation ratio". In this case, it can be said that the LEDs 120 are highly integrated when the area occupation ratio is larger than or equal to 0.7%. In the case of the LED module 100 pertaining to the present embodiment, as the width W7 is 15 mm and the width W8 is 15 mm, the element mounting area is 225 mm$^2$. Since twenty-five LEDs 120 are mounted and each LED 120 occupies an area of 0.16 mm$^2$, the total area occupied by all the LEDs 120 is 4.0 mm$^2$. Hence, the area occupation ratio of the LEDs 120 on the element mounting area is 1.8%.

Alternatively, high integration may be defined by the size of each LED 120 and the distance between two neighboring LEDs 120. In this case, it can be said that the LEDs 120 are highly integrated when all of the following conditions are satisfied: (i) the width W3 of each LED 120 is smaller than or equal to 1.0 mm; (ii) the width w4 of each LED 120 is smaller than or equal to 1.0 mm; and (iii) the distance between two neighboring LEDs 120 in the column and row directions is smaller than or equal to 5.0 mm.

Alternatively, high integration may be defined by the size of each LED 120 and the number of LEDs 120 per unit area on the element mounting area. In this case, it can be said that the LEDs 120 are highly integrated when all of the following conditions are satisfied: (i) the width W3 of each LED 120 is smaller than or equal to 1.0 mm; (ii) the width W4 of each LED 120 is smaller than or equal to 1.0 mm; and (iii) provided the unit area is 1 mm$^2$, the number of LEDs 120 on the element mounting area is 0.04/mm$^2$.

(Method of Manufacturing Light-Emitting Module)

Figure 8:
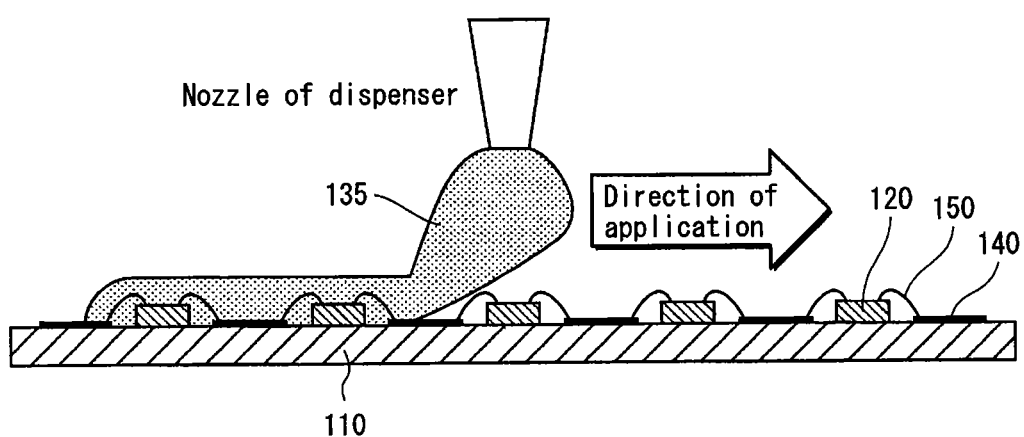
FIG. 8 illustrates a method of forming a sealing member.

Each sealing member 130 pertaining to the present embodiment can be formed according to the following procedure. FIG. 8 illustrates a method of forming a sealing member.

As shown in FIG. 8, a substrate 110 on which a plurality of element columns are arranged in rows is prepared, each element column extending along the row direction and including a plurality of LEDs 120 arranged in line. Then, a resin paste 135 is applied to the substrate 110 by using a dispenser or the like, so as to form lines of resin paste 135 along the element columns. After solidifying the applied lines of resin paste 135, the sealing members 130 are formed in one-to-one correspondence with the element columns.

With the above structure in which the sealing members 130 are formed in one-to-one correspondence with the element columns, the sealing members 130 ($X_1$) to 130 ($X_5$) can easily be formed in a case where the sealing members 130 ($X_1$), 130 ($X_3$) and 130 ($X_5$) are made of a resin material having light transmitting properties and containing selected phosphors that exhibit a daylight color, and the sealing members 130 ($X_2$) and 130 ($X_4$) are made of a resin material having light transmitting properties and containing selected phosphors that exhibit an incandescent light color, as explained above with reference to FIG. 3.

For example, with reference to FIG. 5A, the following steps are performed in a process for applying a resin paste: (i) among LEDs 120 ($Y_1$) to 120 ($Y_5$) that constitute an element column, find the positions of LEDs 120 ($Y_1$) and 120 ($Y_5$) which are at respective ends of the element column in the direction along which the element column extends; (ii) calculate the centers P1 and P2 of side surfaces 121 ($Y_1$) and 121 ($Y_5$) of the LEDs 120 ($Y_1$) and 120 ($Y_5$) along the widthwise direction of the side surfaces 121 ($Y_1$) and 121 ($Y_5$), the side surfaces 121($Y_1$) and 121($Y_5$) facing outside the element column and being perpendicular to the direction along which the element column extends; (iii) after calculating a straight line passing through the centers P1 and P2, consider this straight line as an arrangement axis J2; and (iv) apply the resin paste on the arrangement axis J2.

Alternatively, for example, the following steps may be performed in a process for applying a resin paste: (i) find the positions of LEDs 120 ($Y_1$) and 120 ($Y_5$) which are at respective ends of the element column in the direction along which the element column extends; (ii) calculate a midpoint P3 between the center of the LED 120 ($Y_1$) and the center of the LED 120 ($Y_5$); (iii) after calculating a straight line passing through the midpoint P3 and the center P1 of the side surface 121($Y_1$) of the LED 120($Y_1$) along the widthwise direction of the side surface 121($Y_1$), consider this straight line as an arrangement axis J2; and (iv) apply the resin paste on the arrangement axis J2.

The above methods allow forming a sealing member 130 such that the central axis J1 of the sealing member 130 and the arrangement axis J2 of the element column are coaxially aligned.

Unevenness in the amount of the applied resin paste 135 leads to unevenness in the shapes of sealing members 130, thus lowering reliability of sealing. Furthermore, in a case where the resin paste 135 contains phosphors, unevenness in the amount of the applied resin paste 135 leads to unevenness in the amount of phosphors in the applied resin paste 135, which could cause unevenness in the color. It is therefore preferable that the amount of the dispensed resin paste 135 be constant with high accuracy. More specifically, it is preferable that the amount of the applied resin paste 135 has a tolerance of 0.5 mg or smaller per sealing member 130. In a case where the sealing members 130 are formed by providing lines of resin paste 135 with use of a die, it is important to accurately position the die in relation to the substrate 110, in addition to dispense a constant amount of resin paste 135 with high accuracy. The position of the die in relation to the substrate 110 preferably has a tolerance of 80 μm or smaller.

It is preferable that the viscosity of the resin paste 135 be in a range of 20 Pa·s to 60 Pa·s. If the viscosity of the resin paste 135 is smaller than the above range, the resin paste 135 deforms immediately after the application. This makes it difficult to form the sealing members 130 in the intended shape. If the sealing members are not formed in the intended shape, problems arise in terms of performances (e.g., occurrence of unevenness in the color of light emitted from the light-emitting units 101) and in terms of reliability of sealing (e.g., the wires 150 are exposed to the outside of the sealing members 130). On the other hand, if the viscosity of the resin paste 135 is larger than the above range, then the resistance of the resin paste 135 becomes too high inside the nozzle of the dispenser, which makes application of the resin paste 135 difficult.

By making the viscosity of the resin paste 135 relatively high, i.e., 20 Pa·s to 60 Pa·s, the end portions 131 and 132 of each sealing member 130 in the lengthwise direction can be formed to have a round shape, or can be formed to have a substantially semielliptic cross-section along the widthwise direction. Moreover, by making the viscosity of the resin paste 135 high, the phosphors contained in the resin paste 135 do not easily sink down. As a result, unevenness in the color of light emitted from the light-emitting units 101 hardly occurs.

It should be noted that in order to make the viscosity of the resin paste 135 appropriate, the resin paste 135 preferably contains at least 5 wt % of filler or phosphors. The filler may be, for example, white. Furthermore, in order to suitably maintain the shape of each sealing member 130, it is preferable for each sealing member 130 to have a type-A Shore hardness of 20 or more.

Second Embodiment

Figure 9:
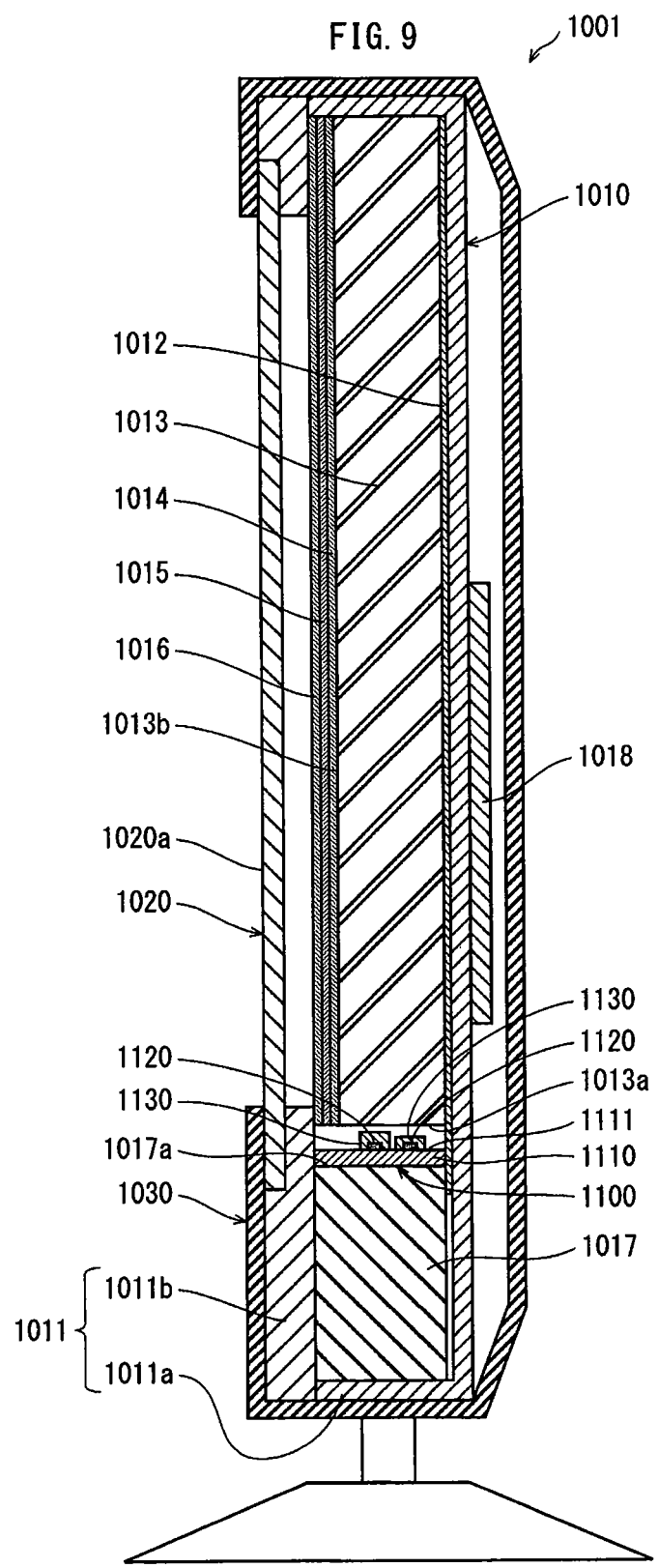
FIG. 9 is a cross-sectional view showing a liquid crystal display device pertaining to Second Embodiment.

FIG. 9 is a cross-sectional view showing a liquid crystal display device pertaining to Second Embodiment. As shown in FIG. 9, a liquid crystal display device 1001 pertaining to Second Embodiment is composed of an edge-lit backlight unit (light source device) 1010, an active-matrix liquid crystal panel 1020, a hosing 1030, and the like. The housing 1030 houses the backlight unit 1010, the liquid crystal panel 1020, and other components.

The backlight unit 1010 is composed of a housing 1011, a reflecting sheet 1012, a light guide plate 1013, a diffusion sheet 1014, a prism sheet 1015, a polarization sheet 1016, a heat sink 1017, a lighting circuit 1018, a plurality of LED modules 1100 as light-emitting modules pertaining to Second Embodiment, and the like. The hosing 1011 is made up of a main body 1011*a* and a front frame 1011*b*.

Each LED module 1100 is composed of a substrate 1110, a plurality of LEDs (light-emitting elements) 1120, and a plurality of sealing members 1130. The substrate 1110 has a mount surface 1111 facing a light incidence surface 1013*a* of the light guide plate 1013. Each LED module 1100 is mounted on a module mount surface 1017*a* of the heat sink 1017.

Figure 10:
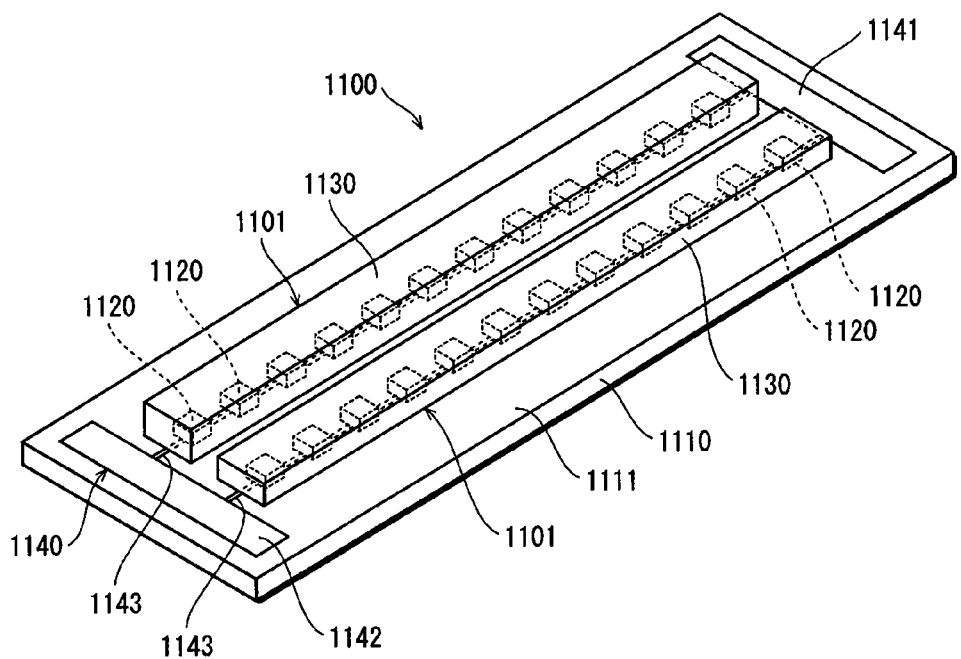
FIG. 10 is a perspective view showing a light-emitting module pertaining to Second Embodiment.

FIG. 10 is a perspective view showing a light-emitting module pertaining to Second Embodiment. As shown in FIG. 10, an LED module 1100 includes two element columns mounted on the substrate 1110 in two rows, each element column including twelve LEDs 1120 arranged in line. Here, each element column is individually sealed by a separate sealing member 1130. A pair of lands 1141 and 1142 for power supply, as well as wiring units 1134 for connecting the LEDs 1120 to one another by series-parallel connection, are provided on the mount surface 1111 of the substrate 1110.

Third Embodiment

Figure 11:
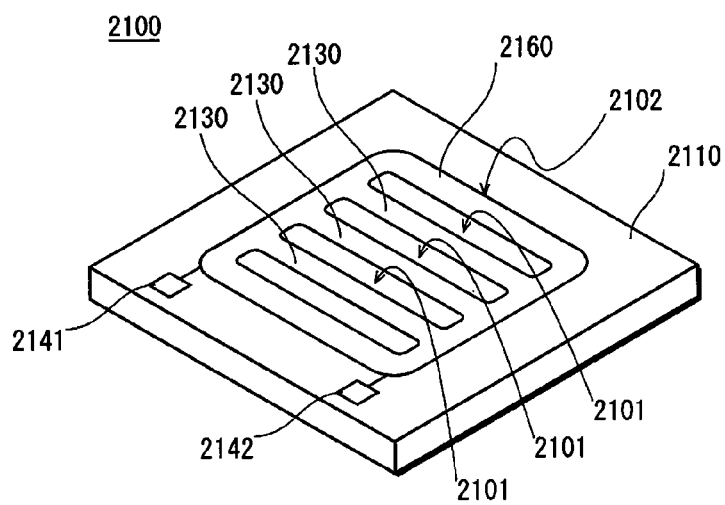
FIG. 11 is a perspective view showing a light-emitting module pertaining to Third Embodiment.
Figure 12:
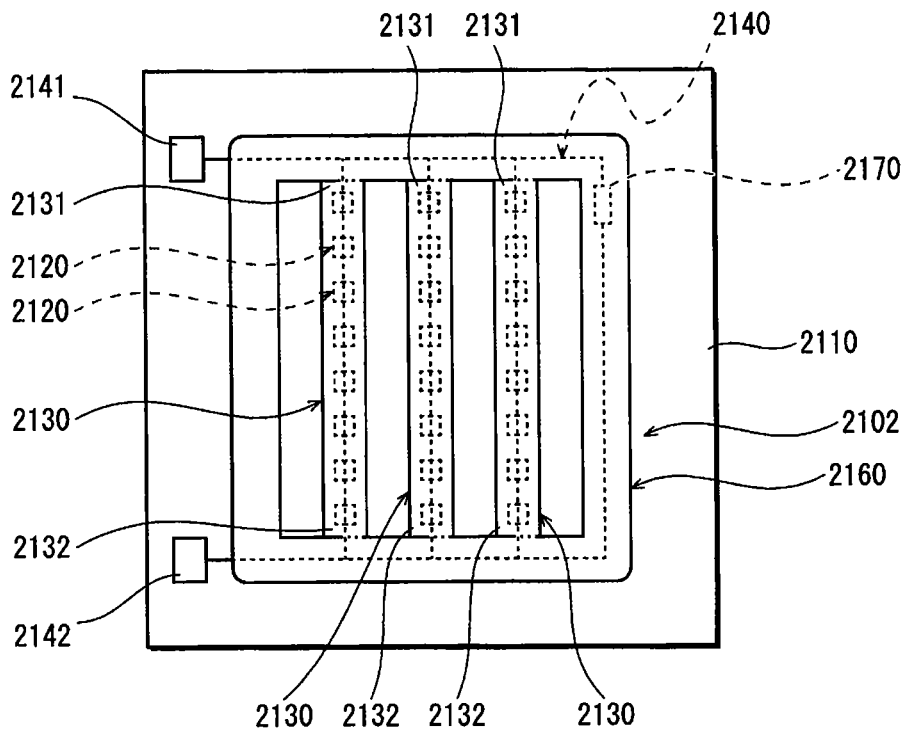
FIG. 12 is a plan view showing a light-emitting module pertaining to Third Embodiment.

FIG. 11 is a perspective view showing a light-emitting module pertaining to Third Embodiment. FIG. 12 is a plan view showing the light-emitting module pertaining to Third Embodiment.

An LED module used as the light-emitting module pertaining to the present invention may be structured such that all sealing members are joined to a joining member formed on a substrate. For example, as shown in FIG. 11, the LED module 2100 is structured such that each of the sealing members 2130 (of the light-emitting units 2101), which are located in the vicinity of the center of the substrate 2110, has its end portions joined to a joining member 2160. Here, all the sealing members 2130 and the joining member 2160 constitute a framework 2102 having a ladder-like structure. More specifically, as shown in FIG. 12, a plurality of element columns are mounted on the substrate 2110 in parallel rows, each element column including LEDs 2120 arranged in line. Each element column is individually sealed by a separate sealing member 2130 having an elongated shape and extending along the element column. One end portion 2131 and the other end portion 2132 of each sealing member 2130 along the lengthwise direction are both joined to the frame-shaped joining member 2160. In a plan view, the framework 2102 constituted by the sealing members 2130 and the joining member 2160 has a shape of a ladder. Note that in FIG. 12, two-dot chain lines indicate borders between the sealing members 2130 and the joining member 2160 (the same goes for FIGS. 13, 15 and 16).

In the present invention, the ladder-like structure denotes a structure in which a plurality of lineal members are joined to one another at end portions thereof. By using the above-described sealing members having a ladder-like structure, a grid-like optical path is formed. This reduces unevenness in the luminance. When the ladder-like structure is employed, it is preferable that the height of the joining member 2160 be similar to or smaller than that of each sealing member 2130 sealing the corresponding element column, so as to suppress blocking of the light emitted from the light-emitting units 2001.

The joining member 2160 is joined to all of the sealing members 2130 that constitute the light-emitting units 2101, and has a shape of a loop enclosing all of the sealing members 2130. The joining member 2160 is made of, for example, the same material as the sealing members 2130. The material of the sealing members 2130 that seal the LEDs 2120 is preferably the same as the material of the joining member 2160 that is joined to one end portion 2131 and the other end portion 2132 of every sealing member 2130, so as to join the sealing members 2130 to the joining member 2160 without forming an interface at the joints. Here, by the term "the same", it means that it suffices if the base of the sealing members 2130, representative examples of which include resin or glass, is made of the same material as the base of the joining member 2160. It is permissible that additives (e.g., phosphors) contained in the base may differ between the sealing members 2130 and the joining member 2160. The material of the joining member 2160 that forms the outer frame of the ladder-like structure need not contain phosphors, or may be a transparent or white material that does not contain any phosphors.

Each LED 2120 is mounted face-up on the substrate 2110, and is electrically connected to lead wires (not illustrated) of a lighting circuit unit via a wiring pattern 2140 formed on the substrate 2110. The wiring pattern 2140 has a pair of lands for power supply (not illustrated), which are electrically connected to connector terminals 2141 and 2142, and a plurality of lands for bonding (not illustrated), which are disposed so as to have a certain positional relationship with the LEDs 2120.

An element other than the LEDs 2120 and a part of the wiring pattern 2140 are sealed in the joining member 2160. The joining member 2160 need not seal the LEDs constituting the element columns. However, in order to preserve the properties of the LED module 1000, the joining member 2160 preferably seals the element other than the LEDs 2120 and the wiring pattern 2140 for the following reason.

When the wiring pattern 2140 is made of metallic members such as Ag wires, there is a concern about deterioration of the wiring pattern 2140 (e.g., oxidization of the surface of the wiring pattern 2140) over time. However, by covering the wiring pattern 2140 with the joining member 2160 as described above, such deterioration can be suppressed.

In the present embodiment, a Zener diode 2170 is sealed as the aforementioned element other than the LEDs 2120. In the Zener diode 2170, electrodes having an opposite polarity from the LEDs 2120 are connected in parallel to one another. As the Zener diode 2170 protects the LEDs 2120 from electrostatic breakdown, the LED module 2100 is highly resistant to noise. It should be noted that many of general-purpose Zener diodes are black. Therefore, positioning the Zener diode 2170 in the vicinity of the LEDs 2120 effectively prevents static electricity, but also causes the Zener diode 2170 to absorb light. In view of this, by covering the Zener diode 2170 with the joining member 2160, absorption of light is effectively suppressed. Also, disposing the Zener diode 2170 at a position distant from the LEDs 2120 effectively suppresses further absorption of light.

It should be noted that the aforementioned element other than the LEDs 2120 is not limited to the Zener diode 2170. Furthermore, the joining member 2160 may seal one or more LEDs 2120.

By way of example, the framework 2102 is formed in the following manner. The substrate 2110 is prepared on which a plurality of element columns are mounted in parallel rows, each element column being composed of LEDs 2120 arranged in line. On the substrate 2110, a line of paste is applied to each element column so as to extend along the element column. By solidifying the applied lines of paste, the sealing members 2130 are formed that each seal a group of LEDs 2120 constituting the corresponding element column. Thereafter, a line of paste is applied so as to be joined to one end portion 2131 and the other end portion 2132 of every sealing member 2130 in the lengthwise direction. By solidifying the applied line of paste, the joining member 2160 that is joined to all of the sealing members 2130 is formed. As a result, in a plan view, the sealing members 2130 and joining member 2160 together form a shape of a ladder.

It should be noted that a method of forming the framework 2102 having a ladder-like structure is not limited to a particular method, as long as it can join the sealing members 2130 each sealing the corresponding element column to one another. Examples of a method of forming the framework 2102 having a ladder-like structure are as follows: (a) after the sealing members 2130 are formed so as to cover the LEDs 2120 mounted on the substrate 2110, form the frame-shaped joining member 2160 that surrounds the sealing members 2130 so as to join one end portion 2131 and the other end portion 2132 of every sealing member 2130 to the joining member 2160; and (b) after the joining member 2160 is formed, form the sealing members 2130 so as to cover the respective element columns.

However, in order to join all of the sealing members 2130 to the joining member 2160 without forming an interface at the joints, it is preferable to first form either the sealing members 2130 or the joining member 2160, and then form the other before the firstly-formed sealing members 2130 or joining member 2160 completely solidifies. Note that when the above-described ladder-like structure is employed, it is preferable that the joining member 2160 be formed so as to extend along the same direction as wires (e.g., Au wires) connecting between the LEDs 2120. This is because if the joining member 2160 is formed so as to extend substantially perpendicular to the direction along which the mounted wires extend, the stress acts in the direction substantially perpendicular to the wires, which makes occurrence of wire cutoff and the like highly likely. For the above reason, it is preferable that the joining member 2160 be formed so as to extend in a direction along which none of the mounted wires extends, or in a direction along which the mounted wires extend.

The LED module 2100 uses the connector terminals 2141 and 2142 as terminals for supplying power to each element column. The connector terminals 2141 and 2142 are not limited to being disposed at particular positions. The connector terminals 2141 and 2142 may be disposed at any positions on the substrate 2110 as long as they can supply power to each element column. Using the connector terminals 2141 and 2142 in the above manner makes electrical connection to the LED module 2100 easy, and also improves the workability of the LED module 2100 (e.g., makes it easy to assemble the LED module 2100). Meanwhile, if the distance between the element columns and the connector terminals 2141 and 2142 is large, then the size of the substrate 2110 may become large as compared to a case where the lead wires are directly soldered to the wiring pattern, and the connector terminals 2141 and 2142 may absorb more light than in the case where the lead wires are directly soldered to the wiring pattern. Accordingly, in a case where the connector terminals 2141 and 2142 are used, it is preferable to adjust the height of each element column, the distance between the connector terminals 2141 and 2142 and the element columns, and the like, so that the connector terminals 2141 and 2142 are not on any of the optical paths of the light emitted from the element columns.

The shape of the joining member 2160, which constitutes the framework having a ladder-shaped structure, is not limited to a certain shape in particular, as long as the joining member 2160 is joined to all of the sealing members 2130 constituting the light-emitting units.

Figure 13:
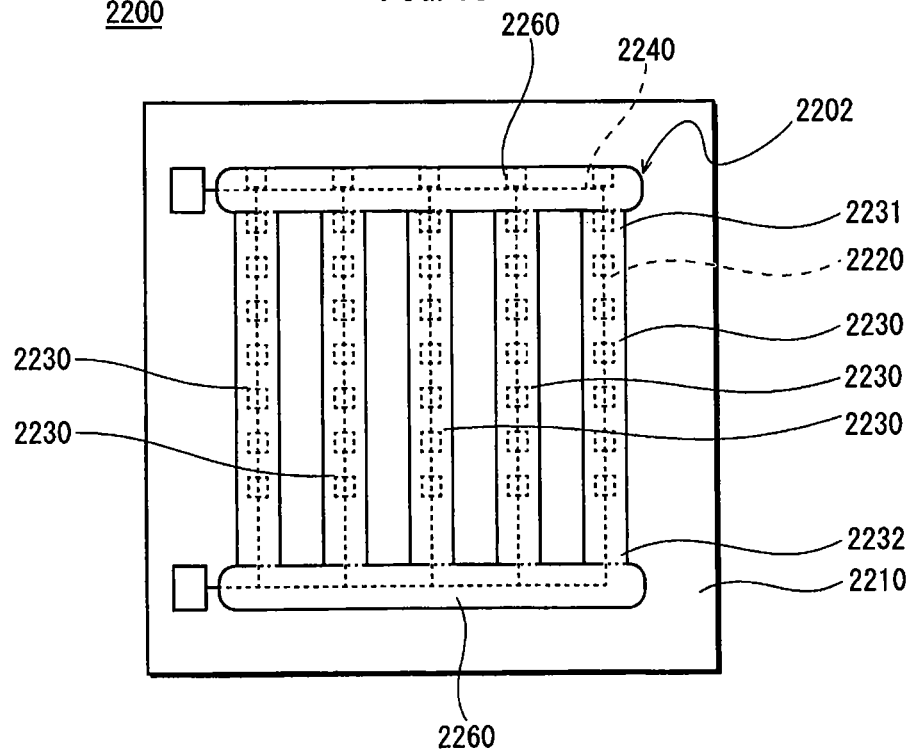
FIG. 13 is a plan view showing a light-emitting module pertaining to a modification example of Third Embodiment.

For example, an LED module 2200 shown in FIG. 13 has a substrate 2210 on which a wiring pattern 2240 is formed. A plurality of element columns, each including a plurality of LEDs 2220, are mounted on the substrate 2210 and connected in parallel to one another. Each element column is sealed by a sealing member 2230. A pair of linear joining members 2260 are formed such that one of the joining members 2260 is at one end portion 2231 of each sealing member 2230 and the other joining member 2260 is at the other end portion 2232 of each sealing member 2230. The joining members 2260 are parallel to each other and sandwich the sealing members 2230 therebetween. The pair of joining members 2260 each have an elongated shape and extend along a direction perpendicular to a direction along which each element column extends. One of the joining members 2260 is joined to one end portion 2231 of each sealing member 2230, and the other joining member 2260 is joined to the other end portion 2232 of each sealing member 2230. The framework 2202 can be formed to have a ladder-like structure also when the above-described joining members 2260 are used.

Figure 14:
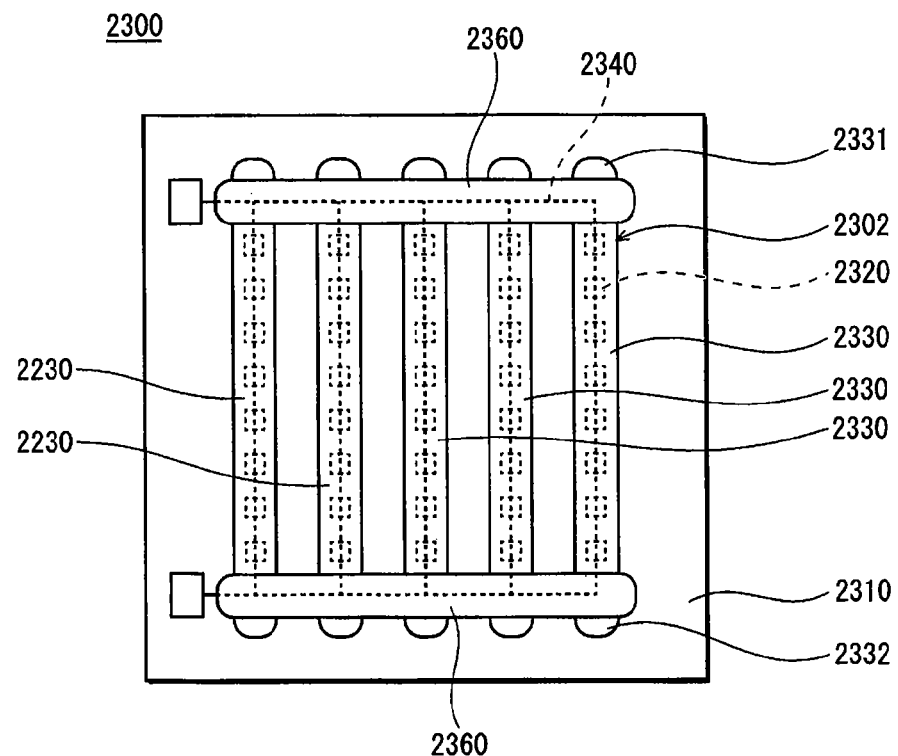
FIG. 14 is a plan view showing a light-emitting module pertaining to a modification example of Third Embodiment.

As another example, an LED module 2300 shown in FIG. 14 has a substrate 2310 on which a wiring pattern 2340 is formed. A plurality of element columns, each including a plurality of LEDs 2320, are mounted on the substrate 2310 and connected in parallel to one another. Each element column is sealed by a sealing member 2330. A pair of parallel linear joining members 2360 are joined to parts of the sealing members 2230. Each sealing member 2330 intersects with the joining members 2360 at a right angle. At the intersections between the sealing members 2330 and the joining members 2360, the joining members 2360 sit on the sealing members 2330. As in the above manner, the joining members 2360 need not necessarily be joined to one end portion 2331 and/or the other end portion 2332 of each sealing member 2330. The framework 2302 can be formed to have a ladder-like structure also when the joining members 2360 are joined to other parts of each sealing member 2330.

Furthermore, the framework constituted from the sealing members and the joining member is not limited to having a ladder-like structure.

Figure 15:
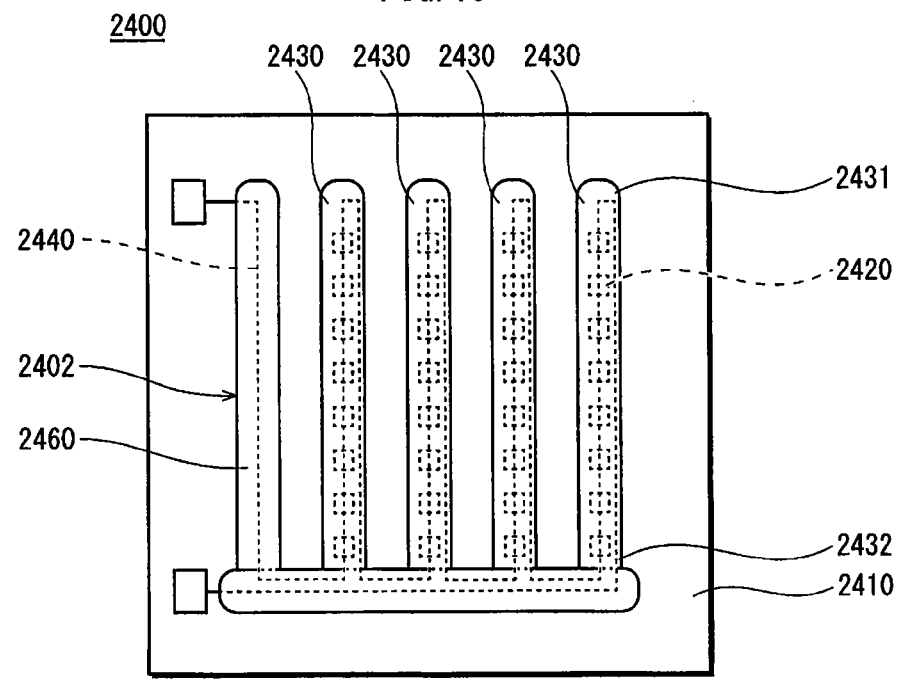
FIG. 15 is a plan view showing a light-emitting module pertaining to a modification example of Third Embodiment.

For example, an LED module 2400 shown in FIG. 15 has a substrate 2410 on which a wiring pattern 2440 is formed. A plurality of element columns, each including a plurality of LEDs 2420, are mounted on the substrate 2410 and connected in series to one another. Each element column is sealed by a sealing member 2430. An L-shaped joining member 2460 is joined only to one end portion 2432 of each sealing member 2430, and is not joined to the other end portion 2431 of each sealing member 2430. When the joining member 2460 has such an L shape, the framework 2402 has a comb-shaped structure.

Figure 16:
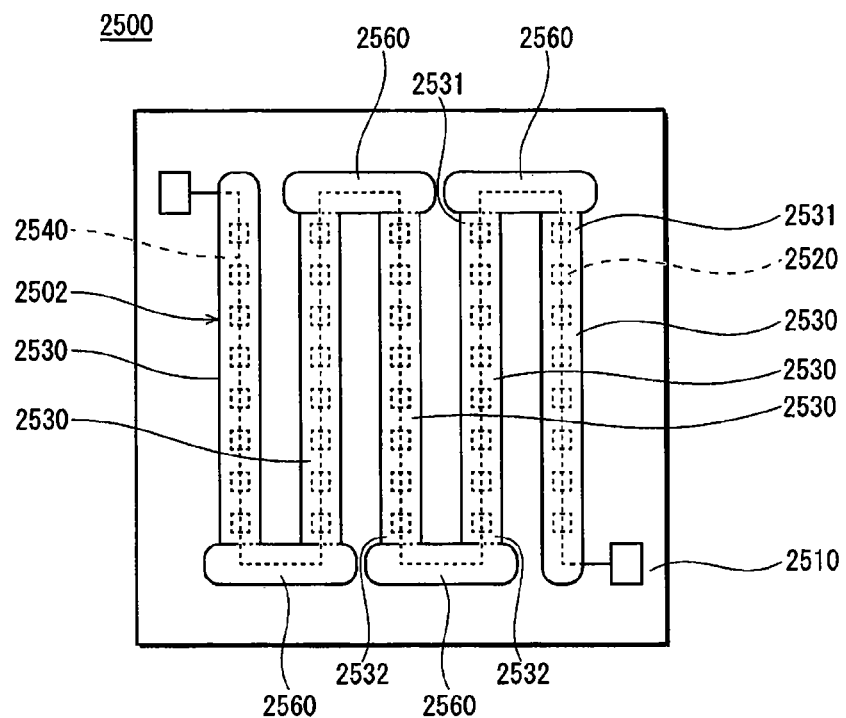
FIG. 16 is a plan view showing a light-emitting module pertaining to a modification example of Third Embodiment.

As another example, an LED module 2500 shown in FIG. 16 has a substrate 2510 on which a wiring pattern 2540 is formed. A plurality of element columns, each including a plurality of LEDs 2520, are mounted on the substrate 2510 and connected in series to one another. Each element column is sealed by a sealing member 2530. Here, one end portion 2531 of the first sealing member 2530 from the right is joined to one end portion 2531 of the second sealing member 2530 from the right, the other end portion 2532 of the second sealing member 2530 from the right is joined to the other end portion 2532 of the third sealing member 2530 from the right, and so on. In this case, the framework 2502 constituted by the sealing members 2530 and joining members 2560 has a linear serpentine shape. As in the above manner, the sealing members 2530 need not be connected to one another at all of one end portions 2531 or all of the other end portions 2532 thereof. It suffices if each sealing member 2530 is at least partially joined to any of the joining members 2560.

Modification Examples

The above has specifically explained the light-emitting module, the light source device and the liquid crystal display device pertaining to the present invention based on the embodiments. However, the light source device pertaining to the present invention is not limited to the above embodiments.

(Form of Wire Bonding)

Figure 17:
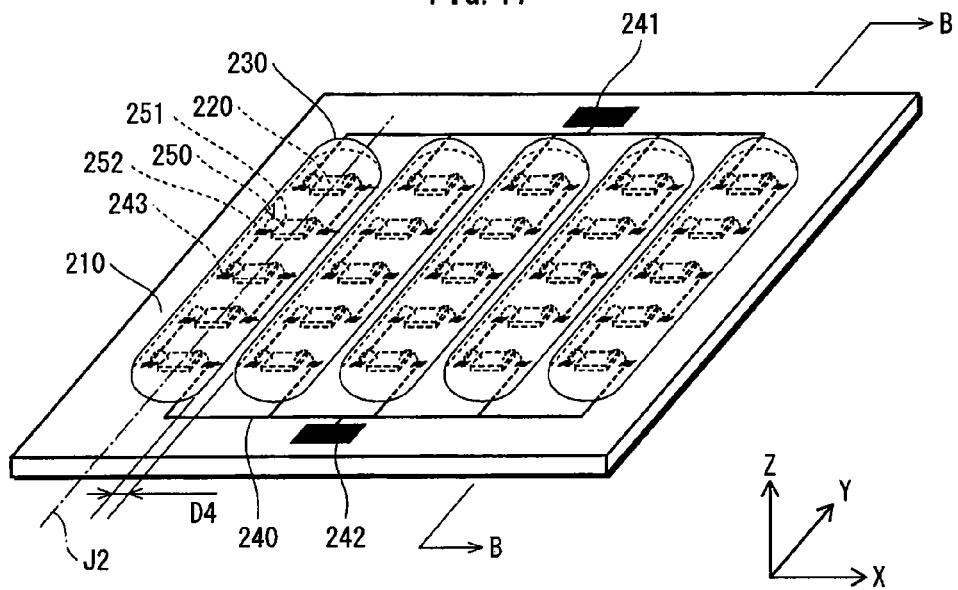
FIG. 17 is a perspective view showing a light-emitting module pertaining to a modification example.
Figure 18A:
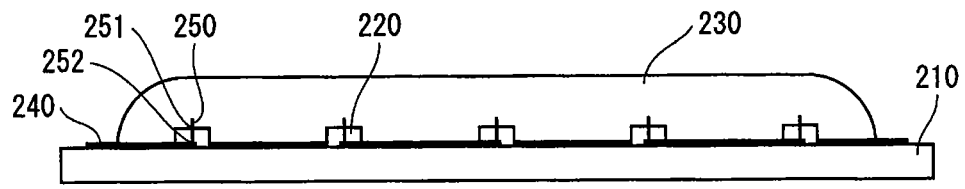
FIGS. 18A and 18B illustrate a wire cutoff caused by expansion and contraction of a sealing member.
Figure 18B:
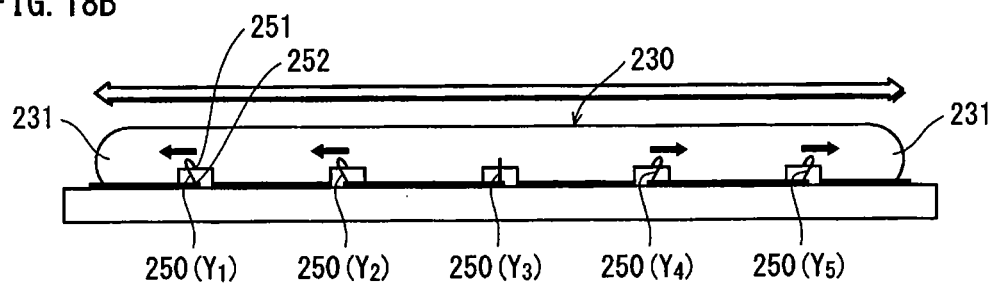

FIG. 17 is a perspective view showing a light-emitting module pertaining to one modification example. FIGS. 18A and 18B illustrate wire cutoff caused by expansion and contraction of a sealing member. The form of wire bonding is not limited to the structure pertaining to First Embodiment, i.e., the structure in which each wire 150 is arranged to extend along an element column to which the light-emitting element that is to be connected to the wire 150 belongs (see FIG. 4B). As shown in FIG. 17, each wire 250 may be arranged to extend along a direction perpendicular to a direction along which the corresponding element column extends.

A light-emitting module 200 has a plurality of element columns that are mounted on a substrate 210 in rows to extend along the row direction. Each element column includes a plurality of LEDs 220 arranged in line, and is individually sealed by a separate sealing member 230. A wiring pattern 240 is formed on the substrate 210. The wiring pattern 240 includes a pair of lands 241 and 242 for power supply, and a plurality of lands 243 for bonding. The LEDs 220 are electrically connected to the wiring pattern 240 via the wires 250. End portions 251 and 252 of each wire 250 are arranged so as to extend along a direction perpendicular to the arrangement axis J2 of the corresponding element column.

With the above structure, the wires 250 could easily be cut off because the direction of expansion and contraction of the sealing members 230 differs from the direction along which the end portions 251 and 252 extend. To be more specific, assume a case where a sealing member 230, which is originally in the shape illustrated in FIG. 18A, expands in a direction along which an element column extends as shown in FIG. 18B (i.e., a direction along which the LEDs in the element column are arranged, as indicated by an open arrow in FIG. 18B). In this case, wires 250 ($Y_1$) and 250 ($Y_5$), which are at respective ends of the element column in the direction along which the element column extends, significantly move in accordance with the movement of the sealing member 230, because the amount of the movement of the sealing member 230 (i.e., the amount shown by filled arrows in FIG. 18B) is large at respective ends of the element column in the direction along which the element column extends. Accordingly, stress concentrates on the end portions 251 and 252 that are connected to the LEDs 220 and the lands 243 and therefore cannot move. This may result in wire cutoff at connecting portions.

Hence, it is preferable that each wire 150 be arranged to extend along the element column to which the light-emitting element that is to be connected to the wire 150 belongs, as shown in FIG. 3. With this structure, even if a sealing member 130 expands in the direction along which an element column extends (i.e., the direction indicated by the open arrow in FIG. 18B), the wires 150 are not easily cut off because the direction of expansion matches the direction along which the wires 150 extend (i.e., the direction indicated by filled arrows in FIG. 18B).

It should be noted that in a case where each wire 250 is arranged to extend along the direction perpendicular to the arrangement axis J2 of the corresponding element column, the width of each sealing member 230 in the widthwise direction increases. This narrows the distance D4 between two neighboring sealing members 230 along the row direction (the X-axis direction) (see FIG. 17), thus reducing the effect of heat dissipation.

(Form of Sealing Member)

Figure 19A:
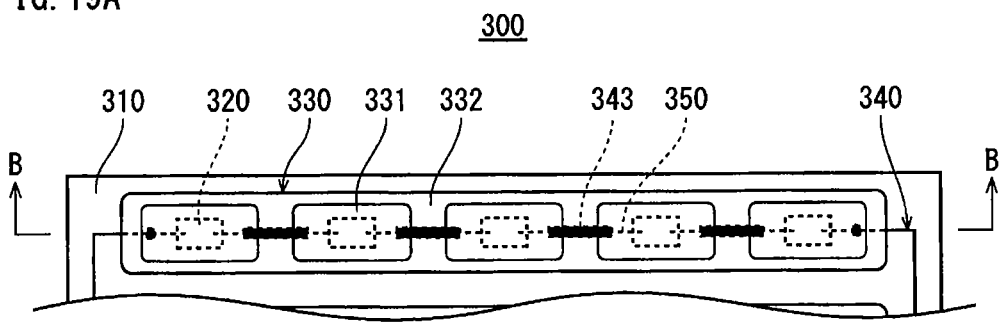
FIGS. 19A and 19B illustrate a sealing member pertaining to a modification example.

The sealing members may be formed in the following manner. FIGS. 19A to 21B illustrate sealing members pertaining to various modification examples. More specifically, FIGS. 19A, 20A and 21A are plan views and FIGS. 19B, 20B and 21B are cross-sectional views taken along B-B in FIGS. 19A, 20A and 21A.

Figure 19B:
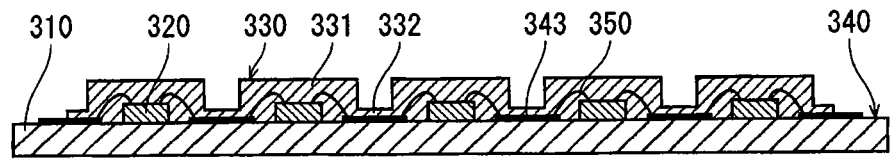

An LED module 300 shown in FIGS. 19A and 19B has a substrate 310 on which a plurality of element columns are mounted in rows to extend along the row direction. Each element column includes a plurality of LEDs 320 arranged in line, and is individually sealed by a separate sealing member 330. The LEDs 320 are electrically connected to lands 343 for bonding, which are a part of a wiring pattern 340 formed on the substrate 310, via wires 350. Each sealing member 330 has (i) thick portions 331 in which the LEDs 320 and the wires 350 are sealed, and (ii) thin portions 332 in which mainly the lands 343 are sealed. As in this example, the thickness, the width, the shape, and the like of each sealing member 330 need not be constant along the corresponding element column. However, it is preferable that at least the LEDs 320 and the wires 350 be sealed in each sealing member 330.

Figure 20A:
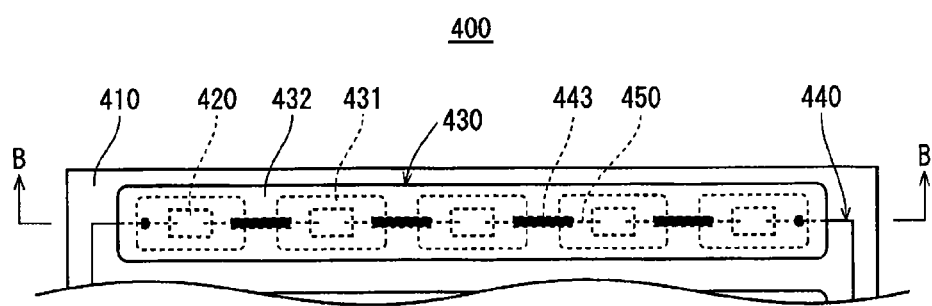
FIGS. 20A and 20B illustrate a sealing member pertaining to a modification example.
Figure 20B:
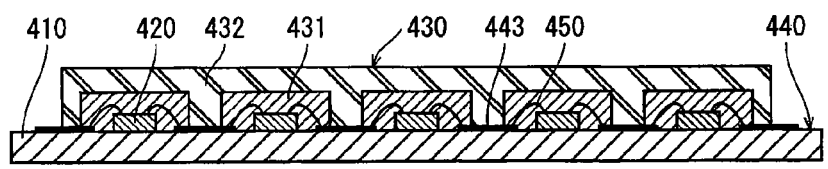

An LED module 400 shown in FIGS. 20A and 20B has a substrate 410 on which a plurality of element columns are mounted in rows to extend along the row direction. Each element column includes a plurality of LEDs 420 arranged in line, and is individually sealed by a separate sealing member 430. The LEDs 420 are electrically connected to lands 443 for bonding, which are a part of a wiring pattern 440 formed on the substrate 310, via wires 450. Each sealing member 430 has first sealing portions 431 containing phosphors, and a second sealing portion 432 containing no phosphors. The first sealing portions 431 only seal the LEDs 420 and the wires 450. The second sealing portion 432, which is formed to extend along the element column, seals the first sealing portions 431 and the lands 443. As in this example, phosphors need not necessarily be contained throughout each sealing member 430, but may be contained only in part of each sealing member 430. Alternatively, each sealing member 430 may not contain any phosphors at all.

Figure 21A:
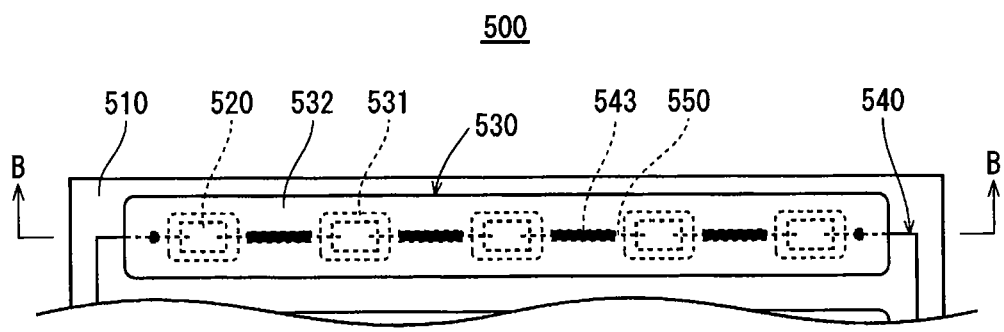
FIGS. 21A and 21B illustrate a sealing member pertaining to a modification example.
Figure 21B:
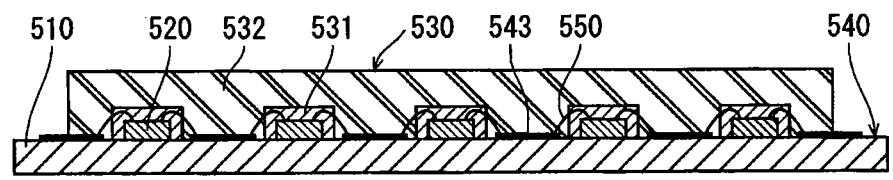

An LED module 500 shown in FIGS. 21A and 21B has a substrate 510 on which a plurality of element columns are mounted in rows to extend along the row direction. Each element column includes a plurality of LEDs 520 arranged in line, and is individually sealed by a separate sealing member 530. The LEDs 520 are electrically connected to lands 543 for bonding, which are a part of a wiring pattern 540 formed on the substrate 510, via wires 550. Each sealing member 530 has first sealing portions 531 containing phosphors, and a second sealing portion 532 containing no phosphors. The first sealing portions 531 only seal the LEDs 520 and parts of the wires 550. The second sealing portion 532, which is formed to extend along the element column, seals remaining parts of the wires 550 and the lands 543. As in this case, it suffices if the phosphors are contained in each sealing member 530 at least in the vicinity of the LEDs 520.

(Form of Element Columns)

The element columns may be formed in the following manner. FIGS. 22 to 25 illustrate element columns pertaining to various modification examples.

Figure 22:
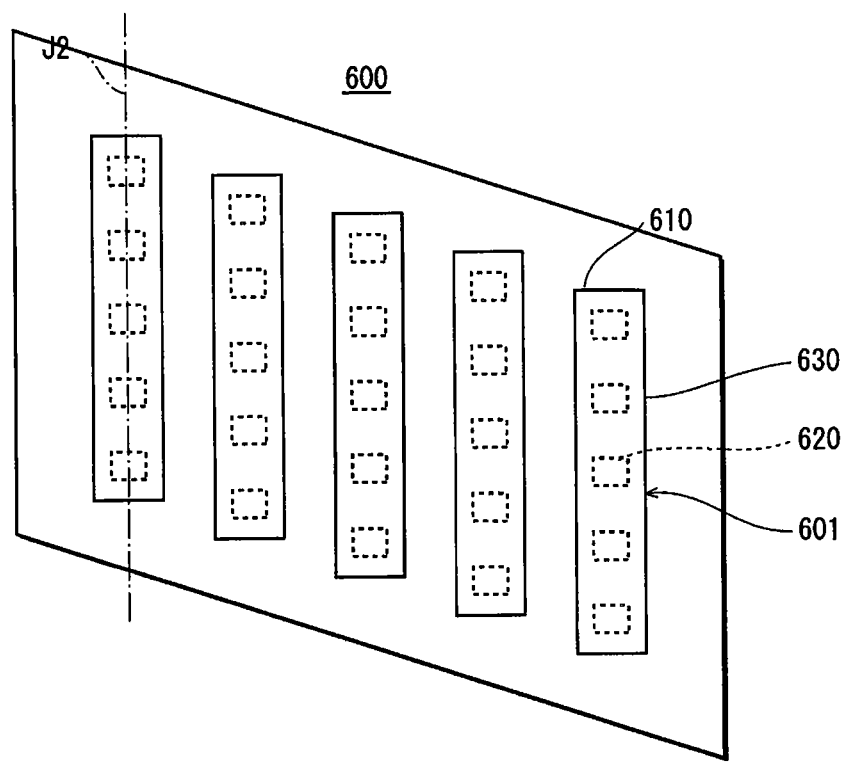
FIG. 22 illustrates element columns pertaining to a modification example.

An LED module 600 shown in FIG. 22 has a substrate 610 on which a plurality of element columns are mounted in parallel rows to extend in the row direction. Each element column includes a plurality of LEDs 620 arranged in line, and is individually sealed by a separate sealing member 630. The element columns are positionally shifted from one another in the column direction. Each of light-emitting units 601 has a linear shape. Positions of end portions of each light-emitting unit 601 are different from positions of end portions of any neighboring light-emitting units 601 along the column direction. As in this example, the element columns may be positionally shifted from one another in the column direction. Furthermore, the element columns may not be parallel to one another.

Figure 23:
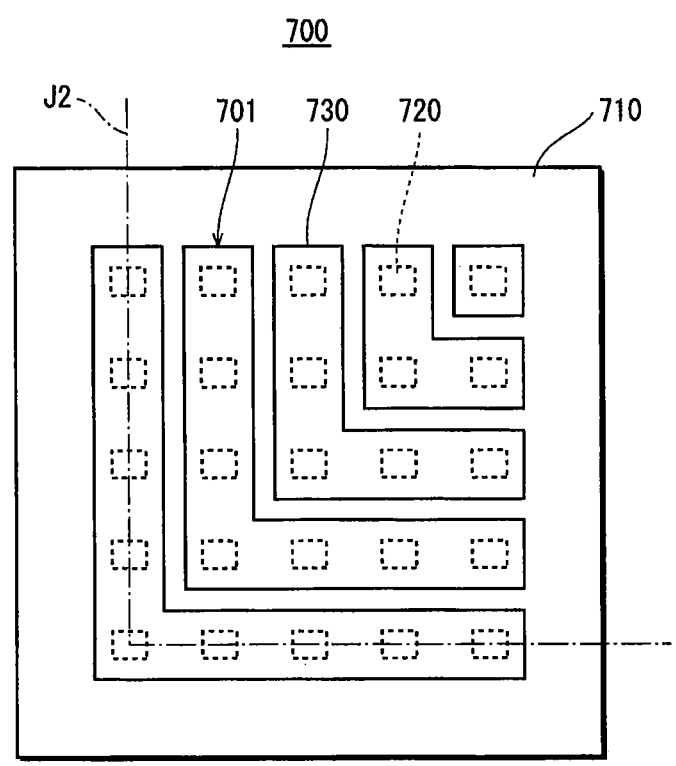
FIG. 23 illustrates element columns pertaining to a modification example.

An LED module 700 shown in FIG. 23 has a substrate 710 on which a plurality of element columns are mounted in rows. Specifically, one element column includes one LED 720 and is sealed by a sealing member 730. Four element columns each include a plurality of LEDs 720 arranged in a substantial shape of the letter "L", and are each individually sealed by a separate sealing member 730 having a substantial shape of the letter "L". Accordingly, light-emitting units 701 corresponding to the aforementioned four element columns each have a substantial shape of the letter "L". As in this example, element columns mounted in rows may be bent to form a shape of the letter "L", "V", or the like.

Figure 24:
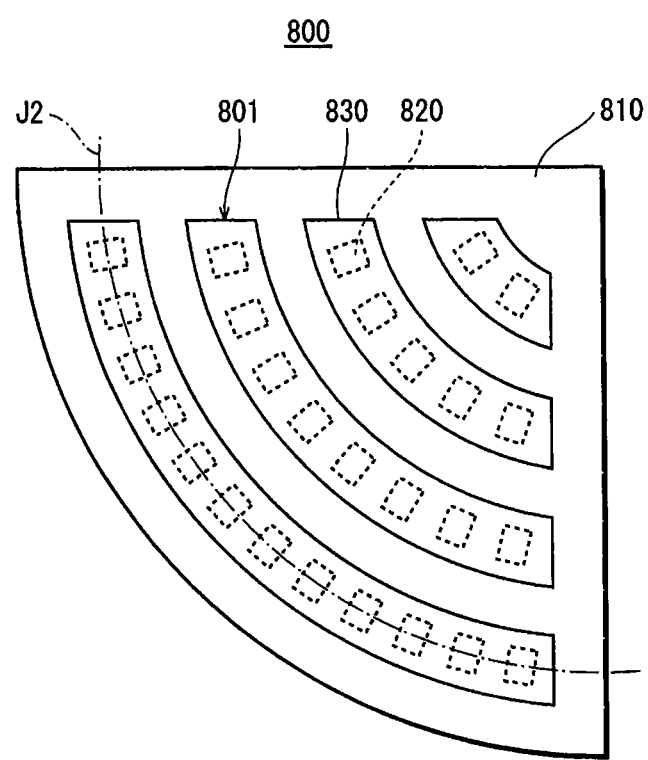
FIG. 24 illustrates element columns pertaining to a modification example.

An LED module 800 shown in FIG. 24 has a substrate 810 on which a plurality of element columns are mounted in rows. Each element column includes a plurality of LEDs 820 arranged in a substantially circular arc and is individually sealed by a separate sealing member 830 having a shape of a substantially circular arc. Accordingly, light-emitting units 801 each have a shape of a substantially circular arc. As in this example, element columns are not limited to having a linear shape, but may be curved.

Figure 25:
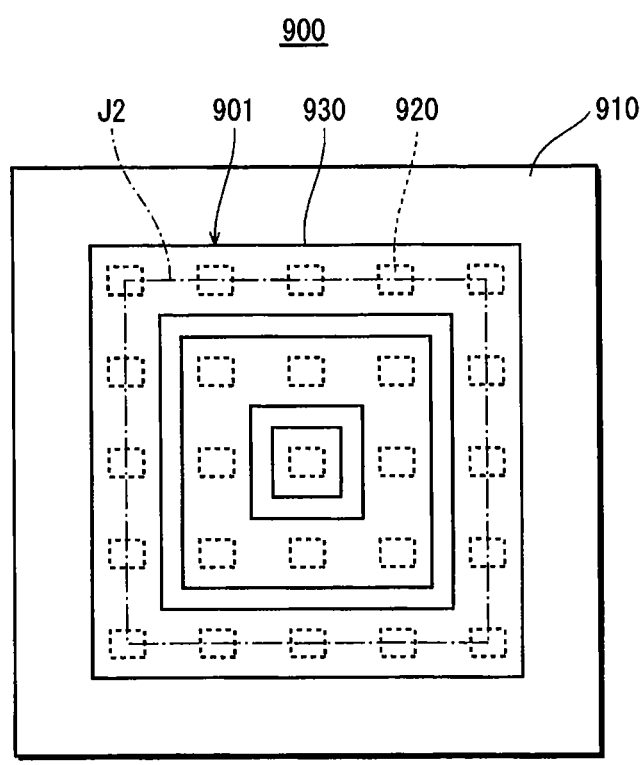
FIG. 25 illustrates element columns pertaining to a modification example.

An LED module 900 shown in FIG. 25 includes a substrate 910 on which a plurality of element columns are mounted in rows. Specifically, one element column includes one LED 920 and is sealed by a sealing member 930. Two element columns each include a plurality of LEDs 920 arranged in a single loop and are each individually sealed by a separate sealing member 930 having a shape of a loop. Accordingly, except for one light-emitting unit 901 located at the center, all light-emitting units 901 have a shape of a loop. As in this example, element columns may have a shape of a loop. It should be noted that a shape of a loop is not limited to the quadrilateral loop shown in FIG. 25, but may be a polygonal loop, a circular loop, an elliptical loop, or the like.

(Other Notes)

In a light-emitting module pertaining to the present invention, a plurality of element columns, each composed of a plurality of LEDs arranged in line, are mounted on a substrate in rows, and each element column is individually sealed by a separate sealing member. Therefore, when the light-emitting module is cut on a per-line basis after the sealing process, a plurality of LED module strips can be obtained on each of which a plurality of LED elements are arranged in line. Furthermore, by properly selecting the positions at which the light-emitting module is cut, it is possible to obtain, at a time, a large number of LED module strips on each of which LED element columns having a desired shape are arranged. This improves high-volume production of module strips.

Light-emitting elements are not limited to LEDs, but may be semiconductor laser diodes, electroluminescence elements, or the like. Also, the color of the light emitted from the light-emitting units is not limited to white, but may be any color. Furthermore, the sealing members may contain different types of phosphors so that the color of emitted light differs among the light-emitting units. For example, it is permissible to alternately arrange light-emitting units that emit light having an incandescent light color and light-emitting units that emit light having a daylight color. This allows switching between an operation of lighting the light-emitting units that emit light having an incandescent light color and an operation of lighting the light-emitting units that emit light having a daylight color.

Figure 26:
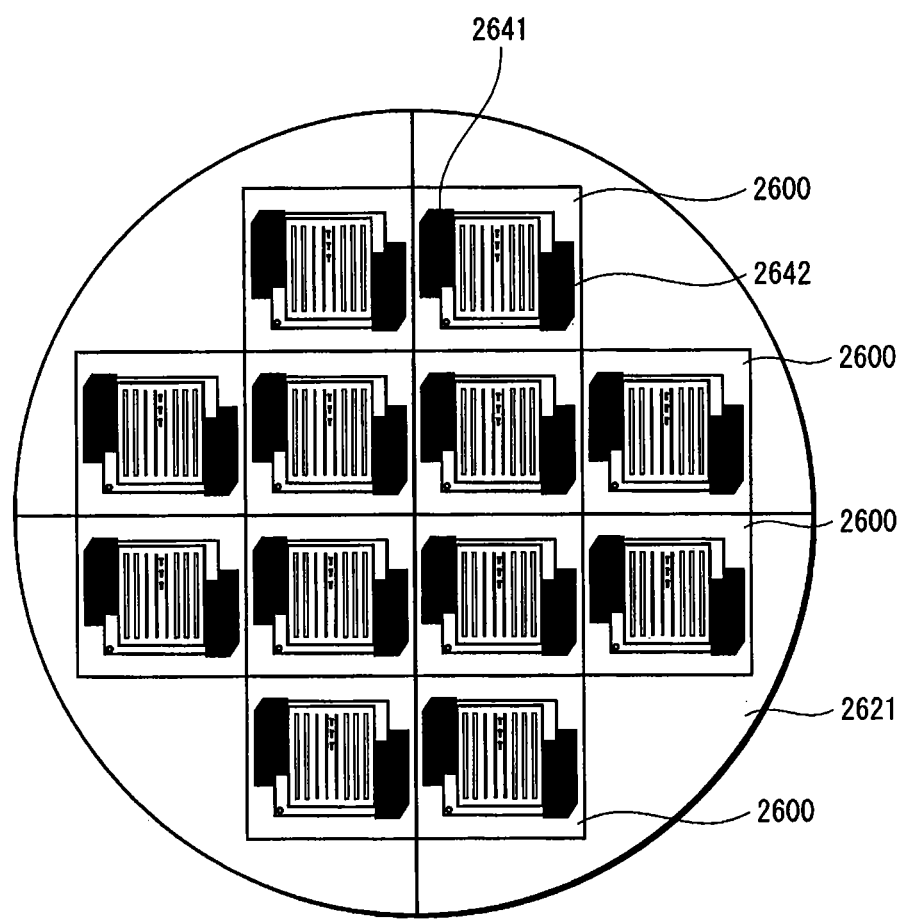
FIG. 26 illustrates an arrangement of LED modules.

Furthermore, by combining a plurality of LED modules pertaining to the present invention, an LED module having a desired size can be obtained. To be more specific, such an LED module having a desired size can be obtained as follows: as shown in FIG. 26, after preparing a plurality of (in the present example, twelve) LED modules 2600 having the same shape, the LED modules 260 are electrically connected to one another in parallel. In this case, if the LED modules 2600 are arranged on a module holding portion 2621 in a concentric manner, then a large-scale LED module aggregate capable of producing highly uniform light can be obtained. Note that the LED modules 2600 may be connected to one another in parallel or in series with use of, for example, connector terminals 2641 and 2642. A method of connection of the LED modules 2600 is not limited to a particular method. However, in a case where a plurality of LED modules 2600 are combined, it is preferable to connect the LED modules 2600 to one another in parallel, in order to prevent failure in lighting caused by defective connection.

A light-emitting module, a light source device, and a liquid crystal display device pertaining to the present invention may be structured based on any partial combination of the embodiments and modification examples the embodiments.

INDUSTRIAL APPLICABILITY

A light-emitting module pertaining to the present invention can be widely used for general lighting purposes.

REFERENCE SIGNS LIST 1 light source device
100 light-emitting module
110 substrate
120 light-emitting element
130 sealing member
140 wiring pattern
150 wire
151, 152 end portion
1001 liquid crystal display device
1010 backlight unit
J1 central axis
J2 arrangement axis

The invention claimed is:

1. A light-emitting module comprising:
a substrate;
a plurality of element columns mounted on the substrate in rows, each element column including a plurality of light-emitting elements arranged in line;
a plurality of translucent sealing members sealing the element columns in one-to-one correspondence therewith;
a linear joining member that is provided on the substrate, and is joined to at least one end portion of each of two or more of the sealing members in a lengthwise direction of the sealing member;
a plurality of wires; and
a wiring pattern provided on the substrate, wherein
the light-emitting elements are electrically connected to the wiring pattern via the plurality of wires that are not in contact with the substrate,
each wire is arranged to extend along the element column, wherein
each light-emitting element is arranged such that a direction of the longest dimension of the light-emitting elements extend along the element column with one of the plurality of translucent sealing members sealing each wire connecting the light-emitting elements.

2. The light-emitting module of claim 1, wherein
the joining member has a shape of a frame surrounding the two or more of the sealing members.

3. The light-emitting module of claim 1, wherein
a framework constituted by the two or more of the sealing members and the joining member has a shape of a ladder in a plan view.

4. The light-emitting module of claim 1, wherein
a material of the sealing members is the same as a material of the joining member.

5. The light-emitting module of claim 1, wherein
the joining member seals one of (i) at least one element other than the light-emitting elements and (ii) the wiring pattern provided on the substrate.

6. A light source device comprising the light-emitting module of claim 1.

7. A liquid crystal display device comprising the light-emitting module of claim 1.

* * * * *